United States Patent
Toyosawa et al.

(10) Patent No.: US 6,670,696 B2
(45) Date of Patent: Dec. 30, 2003

(54) TAPE-CARRIER-PACKAGE SEMICONDUCTOR DEVICE AND A LIQUID CRYSTAL PANEL DISPLAY USING SUCH A DEVICE AS WELL AS A METHOD FOR TESTING THE DISCONNECTION THEREOF

(75) Inventors: Kenji Toyosawa, Ikoma (JP); Takurou Asazu, Nara (JP); Tomohiko Iwane, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/161,478

(22) Filed: Sep. 28, 1998

(65) Prior Publication Data
US 2002/0033524 A1 Mar. 21, 2002

(30) Foreign Application Priority Data

Oct. 15, 1997 (JP) ................................ 9-282319
Oct. 15, 1997 (JP) ................................ 9-282323

(51) Int. Cl.$^7$ .......................................... H01L 23/495
(52) U.S. Cl. ........................................................ 257/667
(58) Field of Search ........................................ 257/667

(56) References Cited

U.S. PATENT DOCUMENTS 5,055,378 A * 10/1991 Miyamura et al.
5,398,128 A * 3/1995 Tajima et al.
5,767,571 A * 6/1998 Kimura et al.

FOREIGN PATENT DOCUMENTS

JP 2509509 * 4/1996

OTHER PUBLICATIONS

Japanese Office Action dated Mar. 11, 2003 and English Translation thereof.

* cited by examiner

Primary Examiner—David E. Graybill
(74) Attorney, Agent, or Firm—Nixon & Vanderhye P.C.

(57) ABSTRACT

A slit is formed in a polyimide substrate and a copper wiring pattern is formed on the surface of the polyimide substrate. Moreover, solder resist, which has a young's modulus in the range of 5 kgf/mm$^2$ to 70 kgf/mm$^2$ and contains a filler in the range of 10 wt % to 40 wt %, is formed on the copper wiring pattern. Thus, the copper wiring pattern becomes less susceptible to disconnection, and it is possible to provide a flex TCP semiconductor device with high manufacturing yield.

18 Claims, 15 Drawing Sheets

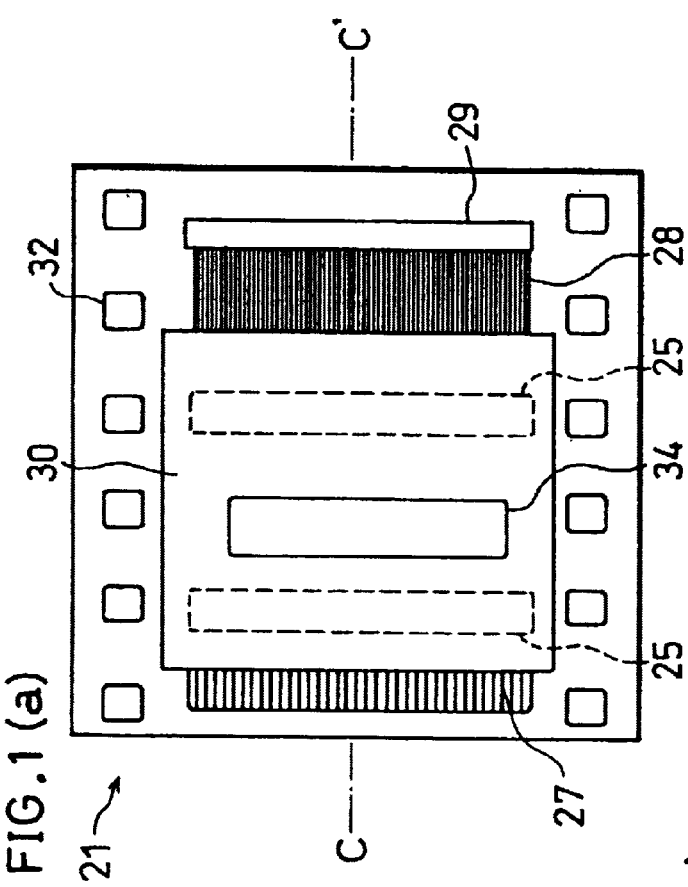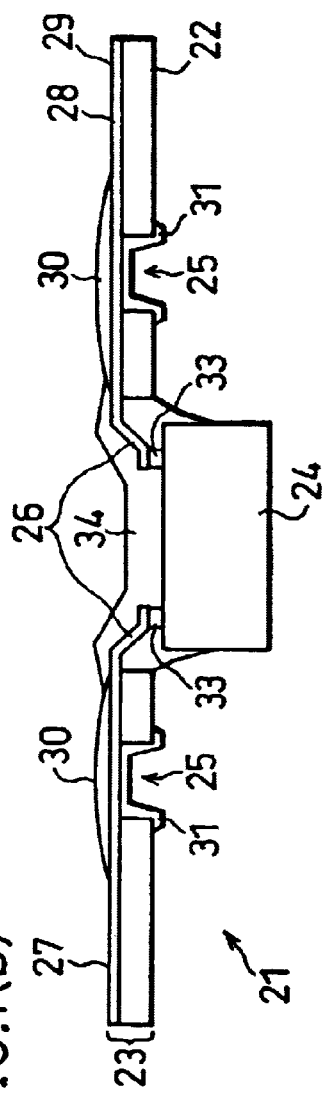

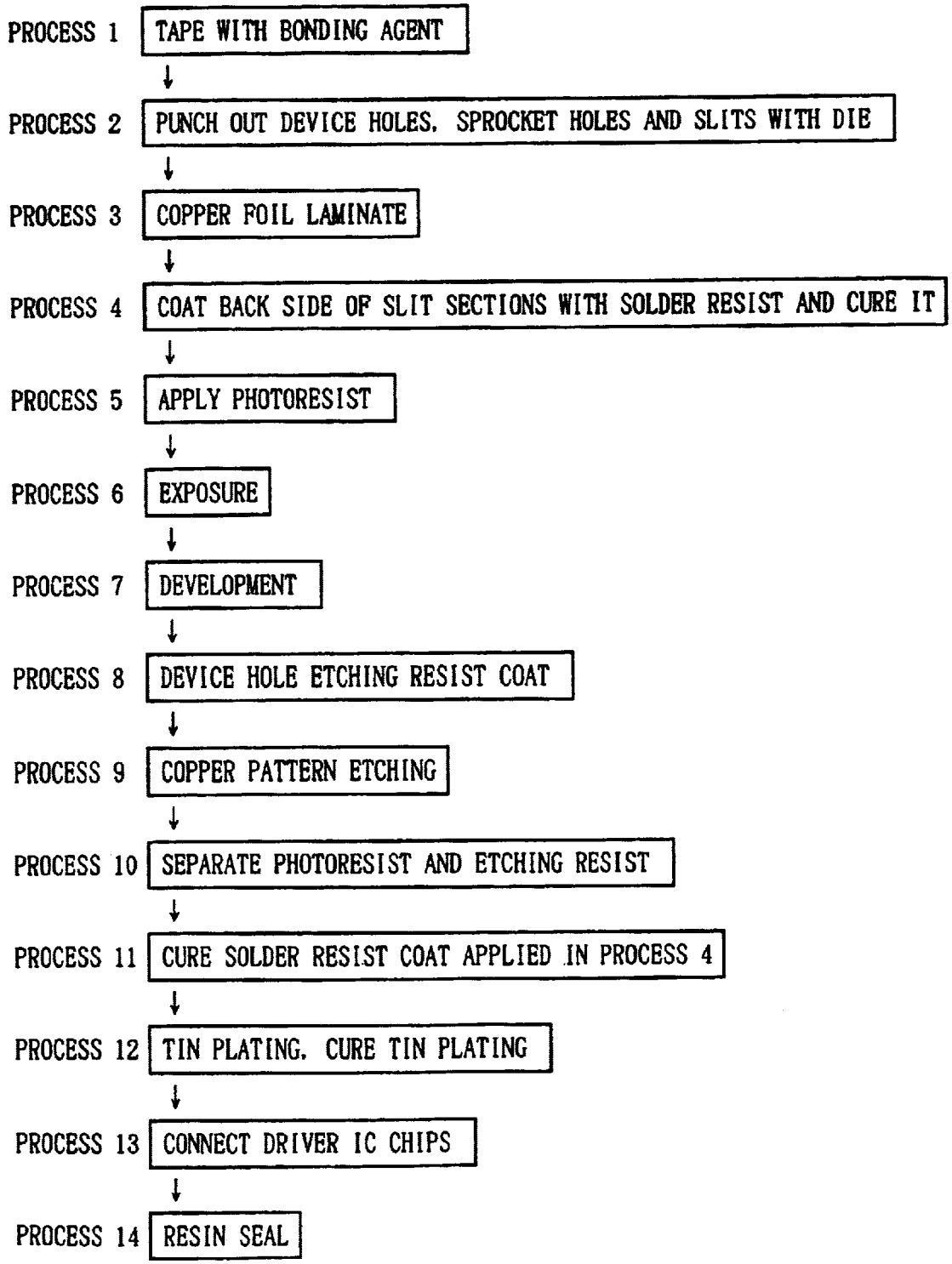

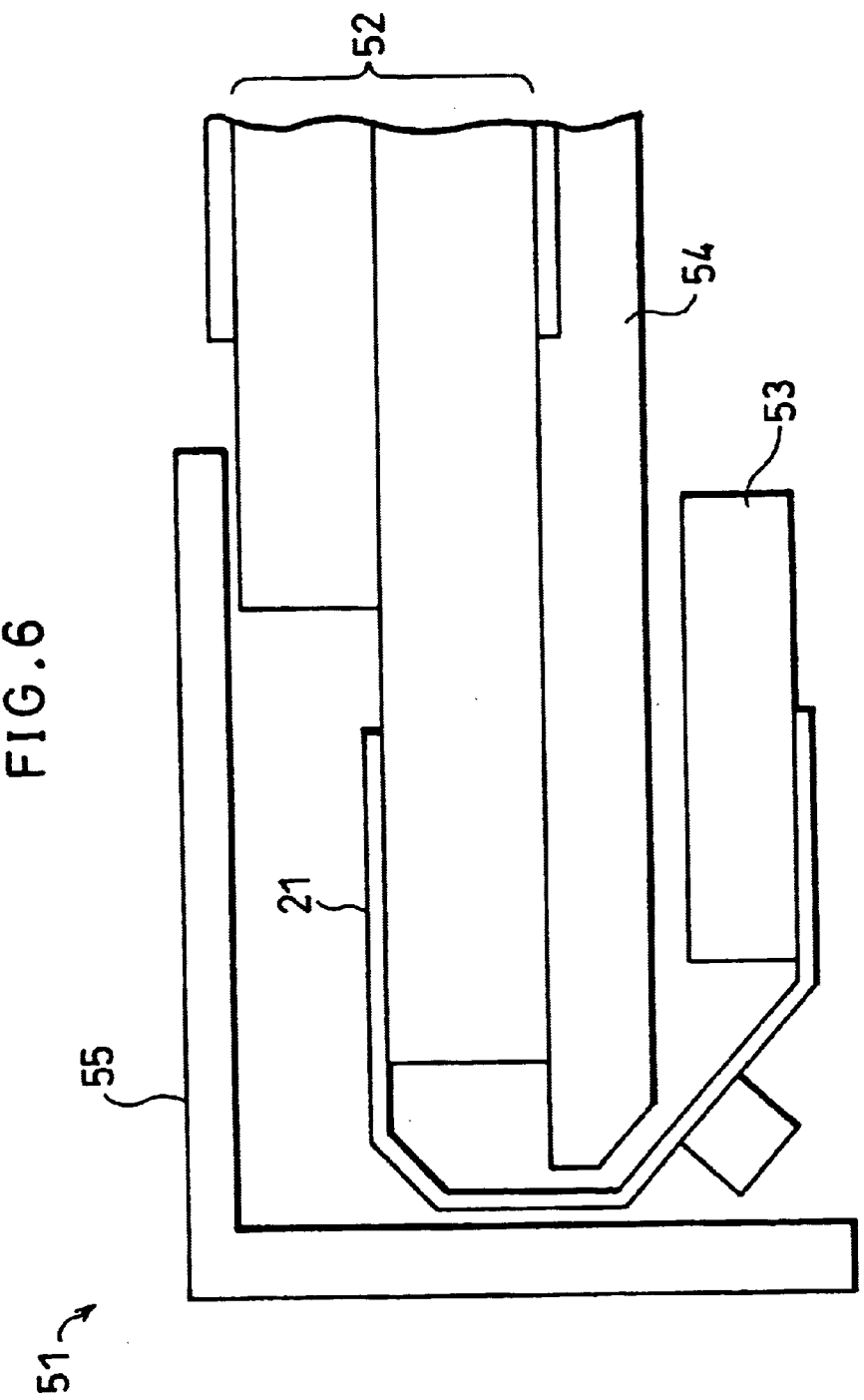

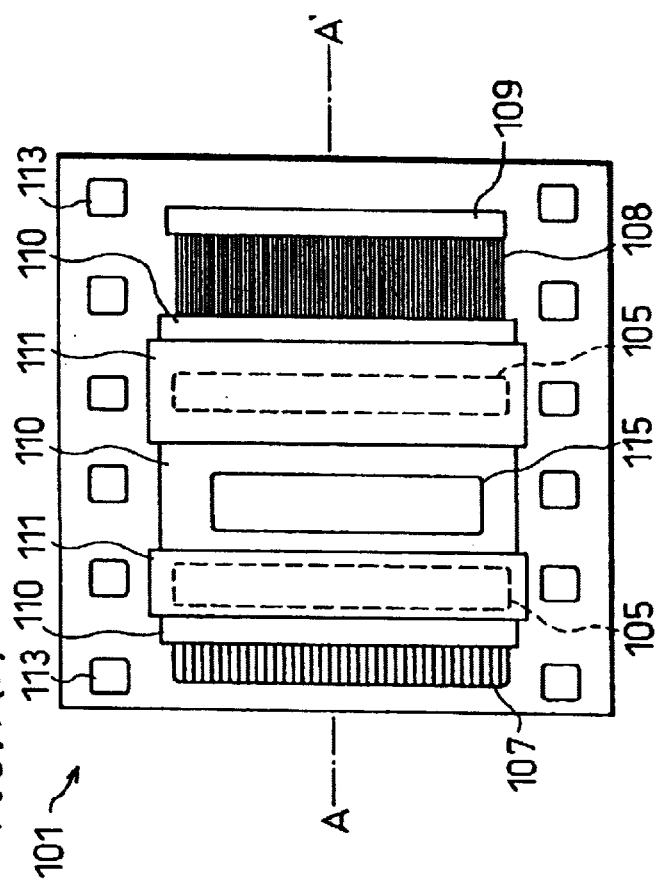
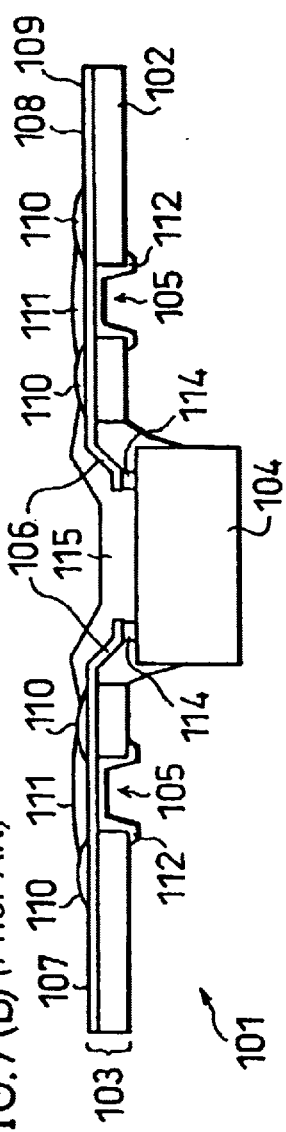
FIG.7(a) (Prior Art)
FIG.7(b) (Prior Art)

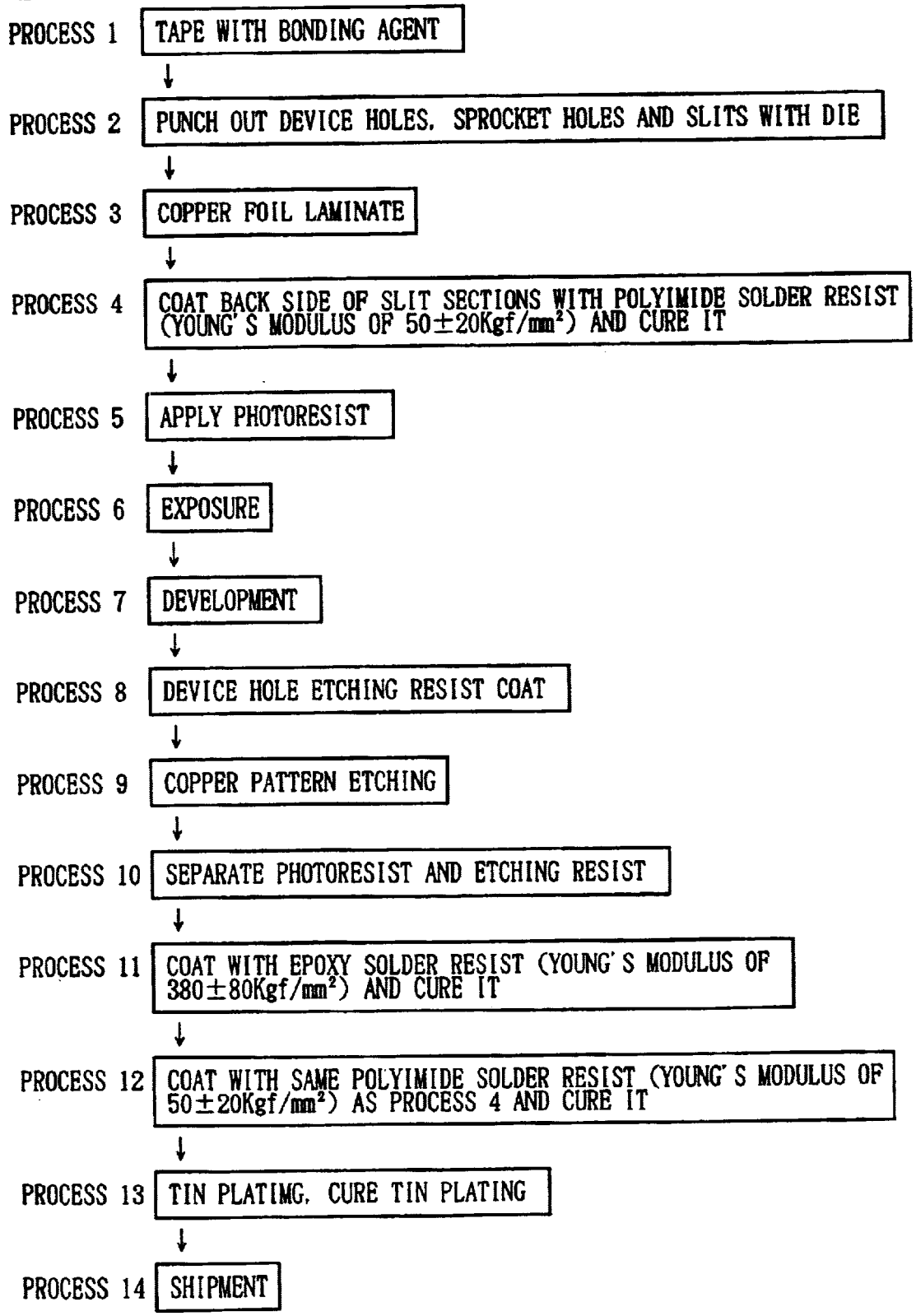

FIG. 8 (Prior Art)

- PROCESS 1: TAPE WITH BONDING AGENT
- PROCESS 2: PUNCH OUT DEVICE HOLES, SPROCKET HOLES AND SLITS WITH DIE
- PROCESS 3: COPPER FOIL LAMINATE
- PROCESS 4: COAT BACK SIDE OF SLIT SECTIONS WITH POLYIMIDE SOLDER RESIST (YOUNG'S MODULUS OF $50\pm20 Kgf/mm^2$) AND CURE IT
- PROCESS 5: APPLY PHOTORESIST
- PROCESS 6: EXPOSURE
- PROCESS 7: DEVELOPMENT
- PROCESS 8: DEVICE HOLE ETCHING RESIST COAT
- PROCESS 9: COPPER PATTERN ETCHING
- PROCESS 10: SEPARATE PHOTORESIST AND ETCHING RESIST
- PROCESS 11: COAT WITH EPOXY SOLDER RESIST (YOUNG'S MODULUS OF $380\pm80 Kgf/mm^2$) AND CURE IT
- PROCESS 12: COAT WITH SAME POLYIMIDE SOLDER RESIST (YOUNG'S MODULUS OF $50\pm20 Kgf/mm^2$) AS PROCESS 4 AND CURE IT
- PROCESS 13: TIN PLATING, CURE TIN PLATING
- PROCESS 14: SHIPMENT

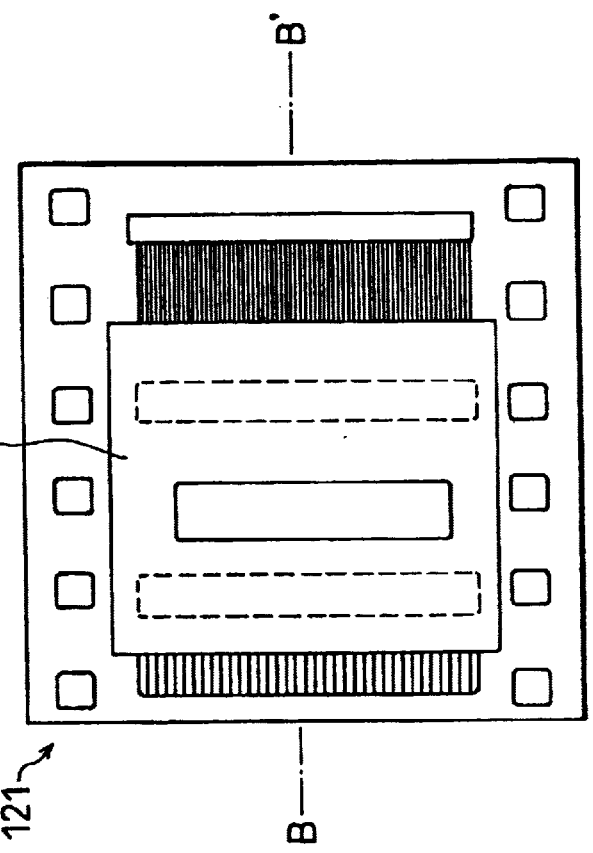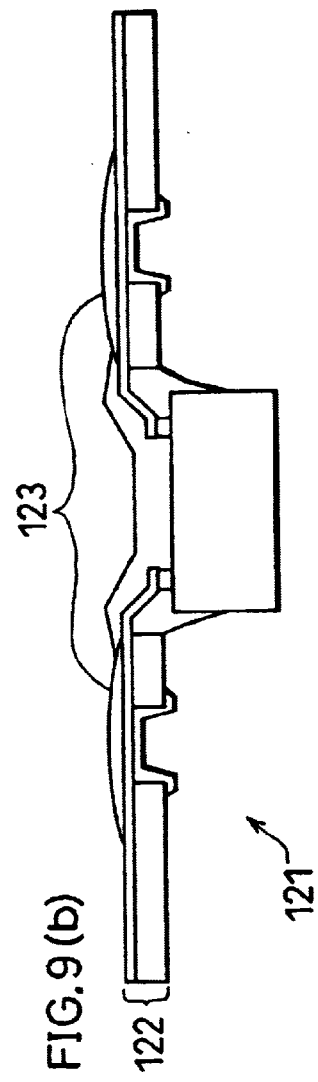
FIG.9(a) (Prior Art)
FIG.9(b)

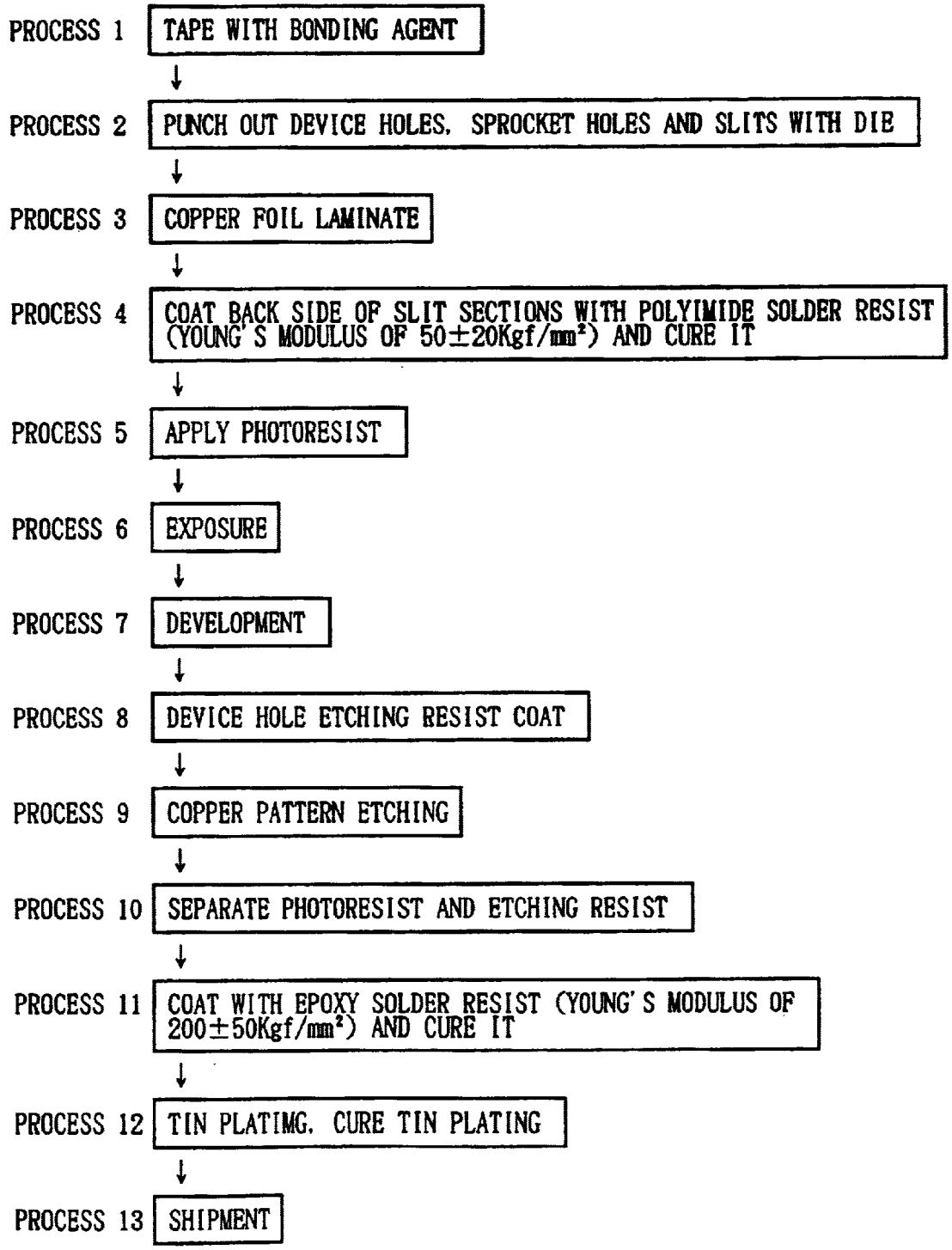

FIG. 10 (Prior Art)

| | |
|---|---|
| PROCESS 1 | TAPE WITH BONDING AGENT |
| PROCESS 2 | PUNCH OUT DEVICE HOLES, SPROCKET HOLES AND SLITS WITH DIE |
| PROCESS 3 | COPPER FOIL LAMINATE |
| PROCESS 4 | COAT BACK SIDE OF SLIT SECTIONS WITH POLYIMIDE SOLDER RESIST (YOUNG'S MODULUS OF $50 \pm 20 \text{Kgf/mm}^2$) AND CURE IT |
| PROCESS 5 | APPLY PHOTORESIST |
| PROCESS 6 | EXPOSURE |
| PROCESS 7 | DEVELOPMENT |
| PROCESS 8 | DEVICE HOLE ETCHING RESIST COAT |
| PROCESS 9 | COPPER PATTERN ETCHING |
| PROCESS 10 | SEPARATE PHOTORESIST AND ETCHING RESIST |
| PROCESS 11 | COAT WITH EPOXY SOLDER RESIST (YOUNG'S MODULUS OF $200 \pm 50 \text{Kgf/mm}^2$) AND CURE IT |
| PROCESS 12 | TIN PLATING, CURE TIN PLATING |
| PROCESS 13 | SHIPMENT |

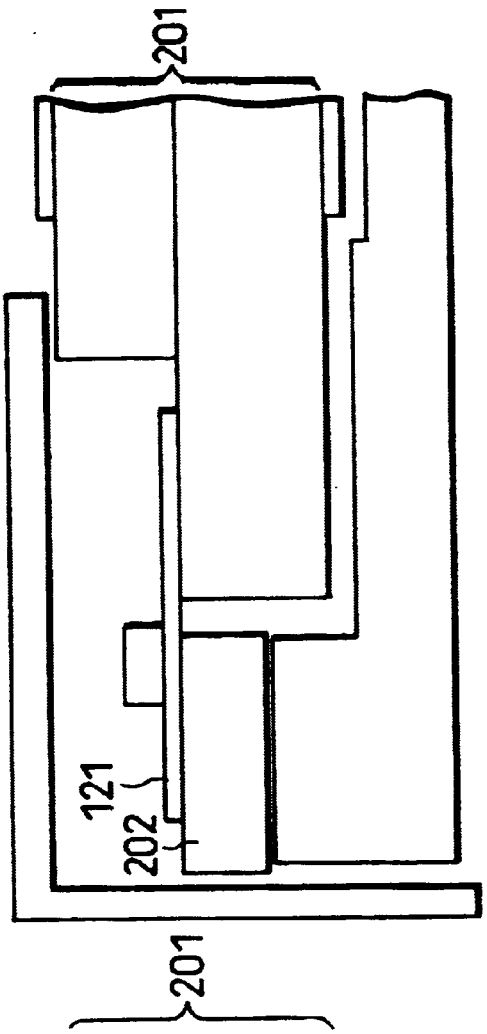
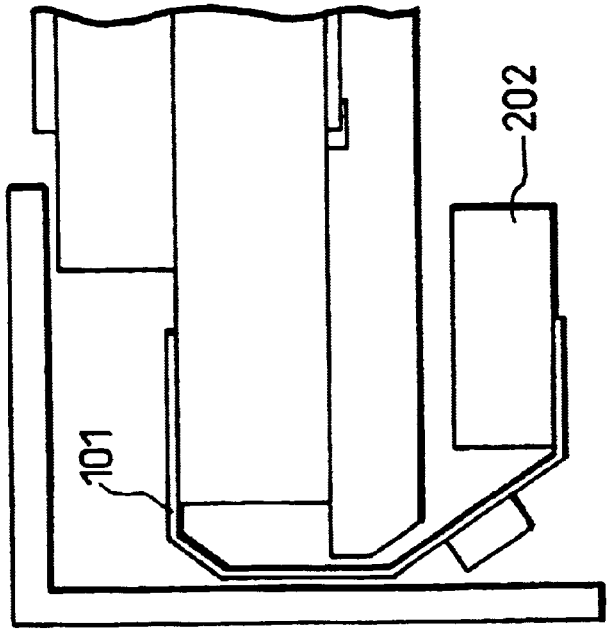
FIG.12(a) (Prior Art)
FIG.12(b) (Prior Art)

FIG.13(a) *(Prior Art)*
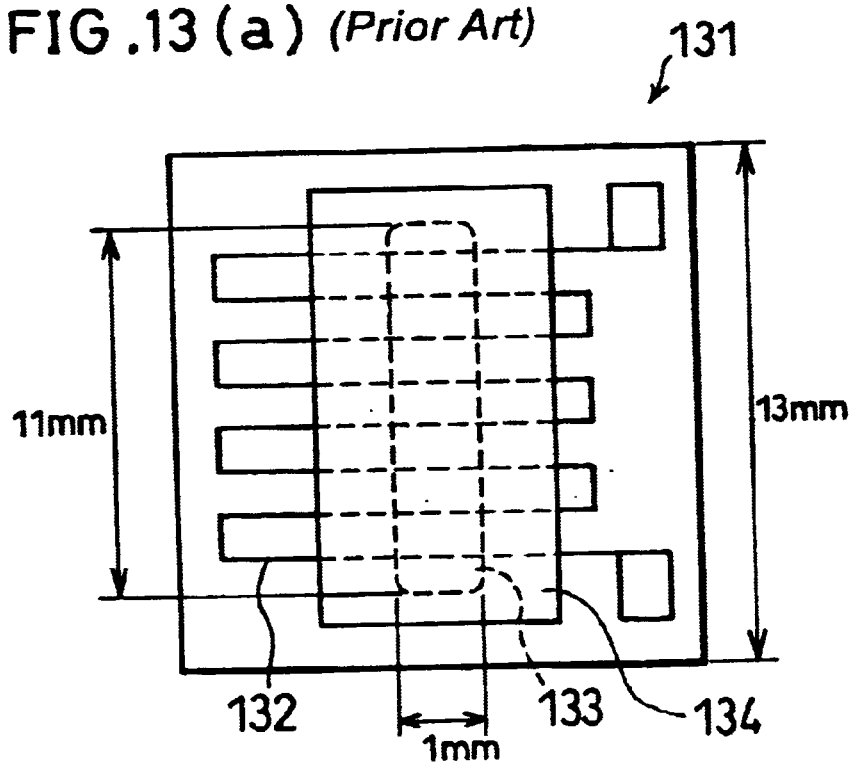
FIG.13(b) *(Prior Art)*
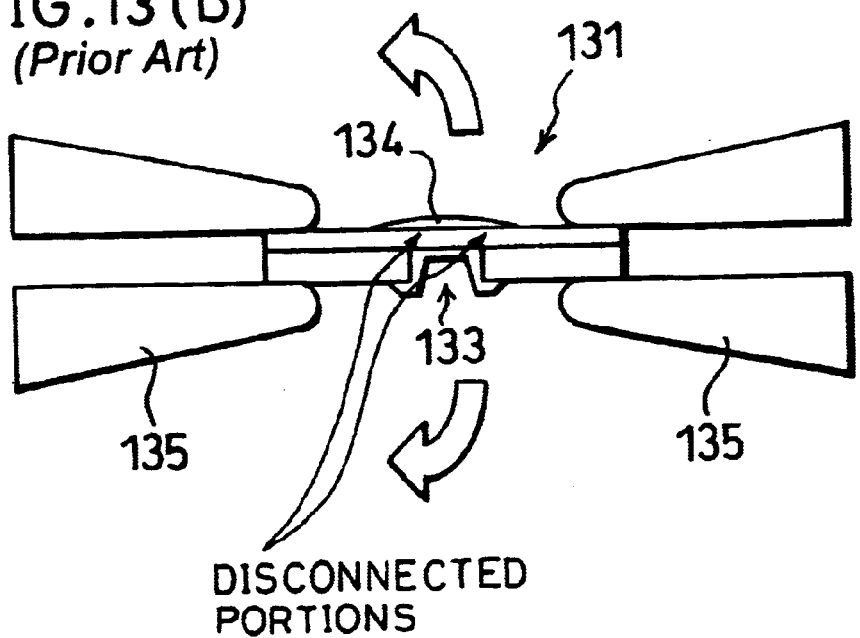
DISCONNECTED PORTIONS

TAPE-CARRIER-PACKAGE SEMICONDUCTOR DEVICE AND A LIQUID CRYSTAL PANEL DISPLAY USING SUCH A DEVICE AS WELL AS A METHOD FOR TESTING THE DISCONNECTION THEREOF

FIELD OF THE INVENTION

The present invention relates to a TCP semiconductor device using solder resist having appropriate flexibility and a liquid crystal panel display using such a device, and also concerns a testing method for disconnection of the wiring pattern thereof.

BACKGROUND OF THE INVENTION

The TCP (Tape Carrier Package) semiconductor device having a flexible bending property is referred to as a flex TCP semiconductor device. The flex TCP semiconductor device is used as a package for driver semiconductors especially in a liquid crystal panel which has a small frame portion.

Recently, there has been a strong trend toward large-size liquid crystal panels, and at present, those panels exceeding 13 inches have been produced for use in notebook PCs (Personal Computers). Therefore, there are ever-increasing demands for the development of flex TCP semiconductor devices used for large-size liquid crystal panels.

FIG. 7(a) is a plan view that shows a schematic construction of a bicolor flex TCP semiconductor device 101 in which two types of solder resists are formed, and FIG. 7(b) is a cross-sectional view taken along line A–A' in FIG. 7(a).

In the construction of the bicolor flex TCP semiconductor device 101, a driver IC chip 104 is electrically connected to a tape carrier 103 that has been formed by using a film-shaped polyimide substrate 102.

The tape carrier 103 has a copper wiring pattern that is constituted by a pair of slits 105, inner leads 106, input-side outer leads 107, output-side outer leads 108 and a test pad 109, pieces of epoxy solder resist 110, pieces of polyimide solder resist 111 and pieces of polyimide solder resist 112 that insulate and coat the slits 105 and the copper wiring pattern, and sprocket holes 113 that are used for leading and positioning the polyimide substrate 102.

In particular, on the copper wiring pattern are provided two types of solder resists, that is, the hard epoxy solder resist 110 with a young's modulus of 380±80 kgf/mm$^2$ and the polyimide solder resist 111 having flexibility with a young's modulus of 50±20 kgf/mm$^2$.

By utilizing its great young's modulus, the epoxy solder resist 110 plays two roles for preventing the occurrence of bleed (flowing of solder resist mainly constituted by its solvent ingredients, after the printing process) in the polyimide solder resist 111, and for preventing the peeling of the edge of the polyimide solder resist 111 in a tin-plating formation process upon manufacturing the tape carrier 103, which will be described later. With this arrangement, the patterning precision of the polyimide solder resist 111 can be improved.

Moreover, the pieces of polyimide solder resist 112 with a young's modulus of 50±20 kgf/mm$^2$ are formed on the undersurface (the back side of the surface on which the copper wiring pattern is formed) of the slits 105.

The driver IC chip 104 is electrically connected to the inner leads 106 through Au bumps 114, and the junctions and their adjacent portions are sealed with resin 115.

Next, referring to FIG. 8, an explanation will be given of manufacturing processes of the tape carrier 103 in the bicolor flex TCP semiconductor device 101 having the above-mentioned construction.

First, the surface of the polyimide substrate 102 (Upilex: Trademark of Ube Industries, Ltd.) is coated with a bonding agent (process 1), and a device hole, a pair of slits 105 and sprocket holes 113, etc. are formed by punching out the polyimide substrate 103 with a die (process 2).

Next, the polyimide substrate 102 is laminated with copper foil having a thickness of either 18 µm, 25 µm or 35 µm (process 3). Moreover, pieces of polyimide solder resists 112 are formed over the pair of slits 105 from the side opposite to the surface on which the copper wiring pattern is to be formed later (process 4).

Then the copper-foil surface is coated with photoresist serving as an etching mask (process 5). Further, the photoresist is printed as a desired pattern through exposure (process 6), and developed (process 7). Here, photoresist serving as an etching mask is also formed over the device hole (process 8). Thereafter, the desired copper wiring pattern is formed by dipping the entire copper foil into a copper-foil etching liquid (process 9). After the copper wiring pattern has been formed in this manner, all of the photoresist is separated by an organic solvent or dry etching (process 10).

Next, on the surface of the polyimide substrate 102 on which the copper wiring pattern has been formed, pieces of epoxy solder resist 110 with a thickness of approximately 25 µm are formed by printing at positions in which two pieces of polyimide solder resist 111, which will later be formed, are sandwiched from both sides (process 11). Thereafter, in a manner so as to cover the slits 105 serving as bending portions, pieces of polyimide solder resist 111, made of the same material as used in process 4, are formed by printing with a thickness of approximately 25 µm (process 12).

Next, tin plating is applied to the surface of the exposed copper foil by the electroless plating method with a thickness of approximately 0.2 µm to 0.6 µm. Further, this tin plating is subjected to a curing process (heating process) so as to prevent the occurrence of whisker (process 13). Whisker refers to a needle-shaped crystal which develops in many kinds of metal when it is subjected to a stress, etc. In particular, whisker tends to develop in tin plating. When whisker develops, short circuits may be exerted between the terminals.

Lastly, the tape carrier 103, which has been manufactured through the above-mentioned processes, is shipped (process 14).

Moreover, another TCP semiconductor device, which has a construction different from the above-mentioned bicolor flex TCP semiconductor device 101, has been known. FIG. 9(a) is a plan view showing a schematic construction of a mono-color flex TCP semiconductor device 121 in which only one kind of solder resist is formed on the copper wiring pattern, and FIG. 9(b) is a cross-sectional view taken along line B–B' in FIG. 9(a).

As illustrated in FIG. 9(a) and FIG. 9(b), pieces of one kind of solder resist 123 are formed on a copper wiring pattern. The solder resist 123 is made of a hard epoxy solder resist having a young's modulus of 200±50 kgf/mm$^2$. The mono-color flex TCP semiconductor device 121 can be produced at very low costs since the number of processes for forming solder resist is fewer than that of the bicolor flex TCP semiconductor device 101. However, because of the use of the solder resist 123 having a greater young's modulus as described above, the mono-color flex TCP semiconductor device 121 is inferior to the bicolor flex TCP semiconductor device 101 in flexibility to bending upon assembly.

FIG. 10 shows manufacturing processes of a tape carrier 122 in the mono-color flex TCP 121. The manufacturing processes are different from those of the tape carrier 103 in the bicolor flex TCP semiconductor device 101 in that, as described above, only one kind of the hard epoxy solder resist 123 having a young's modulus of 200±50 kgf/mm$^2$ is formed on the copper wiring pattern, and the other processes are carried out in the same manner as described above; therefore, the description thereof is omitted.

Next, referring to FIG. 12(a), an explanation will be given of a packaging method of the bicolor flex TCP semiconductor devices 101 onto a liquid crystal panel 201 and a PWB (Printed Wiring Board) 202. In general, for example, in the case of a liquid crystal panel of the 12.1-inch size having 1024 dots×768 dots, upon packaging the bicolor flex TCP semiconductor devices onto the liquid crystal panel, approximately thirteen bicolor flex TCP semiconductor devices are mounted on the source side of the frame edge on one side in the liquid crystal panel 201 as drivers.

First, an ACF (Anisotropic Conductive Film), which is an anisotropic conductive bonding agent, is temporarily press-bonded onto the liquid crystal panel 201. The ACF, which has some kinds in width ranging from 1.2 mm to 3 mm, is properly selected so as to fit the size of the frame edge of the liquid crystal panel 201. Therefore, for example, if the width of the frame edge is narrow, an ACF with a narrow width is selected. Upon temporarily press-bonding the ACF, while the ACF is being affixed onto the liquid crystal panel 201, a tool, heated to 90° C., is pressed thereon for approximately 2 seconds. At this time, the ACF reacts due to the heat and is cured, but is not completely cured so that an actual press-bonding process can be carried out later.

Upon completion of the temporary press-bonding process of the ACF, spacers, which have adhered to the ACF, are separated, and outer leads 108 on the output side of the bicolor flex TCP semiconductor devices 101 are temporarily press-bonded thereto. In this case, the bicolor flex TCP semiconductor devices 101 and the liquid crystal panel 201 are positioned by using alignment marks that have been respectively formed thereon. Prior to this temporary press-bonding process, the bicolor flex TCP semiconductor devices 101, which are connected in a reel shape, are punched out into respective pieces by using a die. Then upon temporarily press-bonding, a tool, heated to 100° C., is pressed thereon with a load of 10 kgf/cm$^2$ for 3 seconds; however, the ACF is not completely cured.

After the temporary press-bonding process of the bicolor flex TCP semiconductor devices 101, an actual press-bonding process is carried out. In the actual press-bonding process, a tool, heated to 200° C., is pressed with a load of 35 kgf/cm$^2$ for 20 seconds onto all the bicolor flex TCP semiconductor devices 101 which have been temporarily press-bonded to the liquid crystal panel 201, at one time.

After the bicolor flex TCP semiconductor devices 101 have been packaged onto the liquid crystal panel 201, outer leads 107 on the input side of the bicolor flex TCP semiconductor devices 101 are joined to the PWB 202. With respect to the packaging method of the bicolor flex TCP semiconductor devices 101 onto the PWB 202, a soldering method and a method using an ACF are applied. In the packaging method by using the ACF, all the bicolor flex TCP semiconductor devices 101 are packaged at one time onto the PWB 202 which has been aligned. At this time, a thermal stress, exerted due to a difference in coefficient of thermal expansion between the PWB 202 and a glass substrate constituting the liquid crystal panel 201, is concentrated on the bicolor flex TOP semiconductor devices 101.

The bicolor flex TCP semiconductor devices 101 have to be bent with the thermal stress being applied thereon so that the PWB 202 is placed on the back side of the liquid crystal panel 201. Consequently, the stress is further concentrated on the copper wiring pattern of the flex TCP semiconductor devices 101. In particular, the thermal stress increases as the liquid crystal panel 201 becomes larger.

Moreover, there is another method in which a straight TCP semiconductor device 121 without slits, as illustrated in FIG. 11, is packaged without being bent as illustrated in FIG. 12(b). In this method, however, unlike the bicolor flex TCP semiconductor device 101, it is not possible to minimize the frame-edge size of the liquid crystal panel 201. Therefore, this packaging method has a disadvantage in the case when a liquid crystal panel, which is as large as possible, is installed inside an apparatus having a limited space, such as a notebook PC.

Next, referring to FIGS. 13(a) and 13(b), an explanation will be given of a testing method for disconnection in the copper wiring pattern of the flex TCP semiconductor device 101. Conventionally, a TEG (Test Element Group) 131 serving as a testing pattern, as illustrated in FIG. 13(a), was manufactured, and the TEG 131 was bent through the MIT (Massachusetts Institute of Technology) method as shown in FIG. 13(b) so as to test the copper wiring pattern 132 for disconnection.

The following description will discuss one example of this testing method. A weight of 100 g was mounted on the TEG 131 that was pinched by jigs 135 at both sides thereof, and the portion of a slit 133 having a width of 1 mm was bent to 0° via 90° with a bending radius of 0.3 mm to 0.4 mm, and further bent so as to return to 180°. When it was bent from 0° to 180°, this was counted as one bending process. These processes were repeated until disconnection had occurred in the copper wiring pattern 132 formed on the slit 133, and the number of bending processes up to the disconnection was calculated. The greater the number of the bending processes up to the disconnection, the better the resistance to bending was considered to be. The resistance varied depending on the solder resist 134 used as the TEG 131, and conventionally, solder resist 134, which did not suffer disconnection even under the MIT tests of 20 times, was conventionally used.

However, in the bicolor flex TCP semiconductor device 101 using two types of solder resist as shown in FIG. 7, solder resist having a great young's modulus is adopted. For this reason, when the bicolor flex TCP semiconductor devices 101 are packaged on a large-size liquid crystal panel of not less than 17 inches, the stress onto the bicolor flex TCP semiconductor devices 101, exerted due to a difference in coefficient of thermal expansion between the liquid crystal panel 201 and the PWB 202, increases, and is concentrated on the copper wiring pattern, making the copper wiring pattern susceptible to disconnection.

In this case, the portion that is most likely to have disconnection is in the vicinity of the outer leads 108 on the output side at which the liquid crystal panel 201 and the bicolor flex TCP semiconductor devices 101 are joined by the ACF, as illustrated in FIG. 13. The larger the size of the liquid crystal panel 201, the more conspicuous the occurrence of disconnection becomes, raising a serious problem in production of the liquid crystal display device.

Moreover, in the bicolor flex TCP semiconductor device 101, the patterning precision of the pieces of epoxy solder resist 110, first formed, is ±0.2 mm, and the patterning precision of the pieces of polyimide solder resist 111, formed thereafter, is ±0.3 mm. Therefore, at portions in which the two types of solder resist contact, the patterning precision becomes ±0.5 mm, which is a comparatively bad value.

Furthermore, in the bicolor flex TCP semiconductor device 101, since the hard epoxy solder resist 110 is used, the bicolor flex TCP semiconductor device 101 itself becomes harder, thereby losing its flexibility. In addition, when hard solder resist is formed on the bicolor flex TCP semiconductor device 101, warping occurs in the bicolor flex TCP semiconductor device 101, failing to smoothly transport the bicolor flex TCP semiconductor device 101 in the assembling process. The warping is more likely to occur in particular when the width of the bicolor flex TCP semiconductor device 101 exceeds 48 mm.

Furthermore, in the bicolor flex TCP semiconductor device 101, since two types of solder resist are formed, two dedicated printing machines for printing these two types are required, and the management of solder resist becomes more complicated. The resulting problem is an increase in the production cost of the tape carrier 103.

In contrast, when only polyimide solder resist is formed as the solder resist, two problems, that is, warping of the flex TCP semiconductor device and an increase in the production cost of the tape carrier, can be solved. However, since polyimide solder resist has a low thixotropy, bleeding 142 occurs on the pattern edge 141 as shown in FIG. 14. Thixotropy refers to a scale for estimating the property of a substance in which stirring causes a reduction in viscosity while standing causes an increase in viscosity is estimated. For example, when the thixotropy of the solder resist is high, the patterning precision becomes better upon printing because of a reduction in viscosity, and the occurrence of bleeding is reduced after printing because of an increase in viscosity. Here, FIG. 14 is an enlarged view in which one portion of the upper surface of a TCP semiconductor device suffering bleeding 142 is shown in an enlarged manner.

Therefore, when the thixotropy is low, the pattern edge 141 of the solder resist 143 is not printed accurately, resulting in failure to properly manufacture the tape carrier. Moreover, solder resist 143 flows to reach the inner leads 144 inside the device holes of the tape carrier, resulting in a problem in which no bonding is available during an ILD (Inner Lead Bonding) process.

Moreover, another problem with the conventional bicolor flex TCP semiconductor device 101 is that pieces of polyimide solder resist 112, formed on the back side of the slits 105, have their pattern edge separated during the tin plating process and that the separated solder resist causes dusts, thereby contaminating the tape carrier 103.

Furthermore, in the flex TCP semiconductor device in which only polyimide solder resist is used as the solder resist, during the process for sealing the inner leads with resin, since the polyimide solder resist merely has a low adhering property to liquid epoxy resin, it becomes difficult to manufacture the flex TCP semiconductor device.

In addition to the above-mentioned problems, the MIT testing method for testing disconnection of the copper wiring pattern of the flex TCP semiconductor device 101 also has the following problem: In the MIT test, although disconnected portions, which are to be tested, are located in the vicinity of the edge of the slit 133 as shown in FIG. 13(b), these portions are different from actual disconnected portions that occur upon being bent after the flex TCP semiconductor devices 101 have been packaged on the liquid crystal panel 201 and the PWB 202. The disconnected portions occurring due to the bending after the packaging are located in the vicinity of the edges of portions at which the flex TCP semiconductor devices 101 are joined to the liquid crystal panel 201 as shown in FIG. 15.

Moreover, as the size of the liquid crystal panel becomes larger, the stress to the flex TCP semiconductor devices 101, which is exerted due to a difference in coefficient of thermal expansion between the liquid crystal panel 201 and the PWB 202, increases, and the stress is concentrated on the copper wiring pattern, making it more susceptible to disconnection. For example, although defects due to disconnection seldom occur in the case of the liquid crystal panel of 10.4 inches, they become conspicuous in the case of the large-size liquid crystal panel exceeding 11.3 inches.

In other words, although the MIT test can detect failure due to disconnection in the slit 133, it fails to properly evaluate the resistance to bending of the flex TCP semiconductor devices 101 upon packaging. Therefore, for example, even when, in the MIT test, a better result is obtained in flex TCP semiconductor devices using one type of epoxy solder resist than in flex TCP semiconductor devices using two types of solder resist, it sometimes happens in an actual packaging process on a liquid crystal panel that those device using one type of epoxy solder resist are more susceptible to disconnection.

As described above, in the conventional disconnection-testing method, it is not possible to determine a manufacturing method for flex TCP semiconductor devices which would be suitable for large-size liquid crystal panels. Moreover, even if the evaluation is made by actually packaging the flex TCP semiconductor devices on a liquid crystal panel, the possibility of occurrence of defects due to disconnection in the liquid crystal panel packaging process is normally in the order of PPM, that is, very low, failing to allow rational evaluation in a short period. Therefore, it is not possible to easily find a method for producing large-size liquid crystal displays exceeding 15 inches, which are more likely to have defects due to disconnection, with high yield.

SUMMARY OF THE INVENTION

The objective of the present invention is to provide a tape carrier package semiconductor device which is highly flexible and less susceptible to disconnection in the metal wiring pattern upon packaging, a liquid crystal display using such a device, and a disconnection-testing method for such a device.

In order to achieve the above-mentioned objective, the tape carrier packaging semiconductor device of the present invention, which has a tape carrier and semiconductor devices that have been packaged on the tape carrier, is characterized in that the tape carrier is provided with an insulating tape, a metal wiring pattern installed on one surface of the insulating tape, a through hole that is provided in a manner so as to penetrate the insulating tape so that the insulating tape is allowed to bend, a first insulating protective film for insulating and covering the metal wiring pattern and the through hole on the metal-wiring-pattern side, and a second insulating protective film for insulating and covering the through hole on the side opposite to the metal-wiring-pattern side, and also characterized in that the first and second insulating protective films are made of solder resist whose young's modulus is in the range of 5 kgf/mm$^2$ to 70 kgf/mm$^2$.

With the above-mentioned construction, since the young's modulus is set in the range of 5 kgf/mm² to 70 kgf/mm², the solder resist functions as a very flexible insulating protective film.

Therefore, for example, even if the tape carrier package semiconductor devices are packaged on a liquid crystal panel, the metal wiring pattern is hardly susceptible to disconnection. Further, the occurrence of warping in the tape carrier package semiconductor devices is reduced, and the manufacturing cost of the tape carrier can be reduced.

Moreover, the liquid crystal panel display of the present invention, which is provided with a tape carrier package semiconductor device having a tape carrier and semiconductor devices for driving a liquid crystal panel that are installed on the tape carrier and the liquid crystal panel, is characterized in that the tape carrier is provided with an insulating tape, a metal wiring pattern installed on one surface of the insulating tape, a through hole that is provided in a manner so as to penetrate the insulating tape so that the insulating tape is allowed to bend, a first insulating protective film for insulating and covering the metal wiring pattern and the through hole on the metal-wiring-pattern side, and a second insulating protective film for insulating and covering the through hole on the side opposite to the metal-wiring-pattern side, and also characterized in that the first and second insulating protective films are made of solder resist whose young's modulus is in the range of 5 kgf/mm² to 70 kgf/mm².

With the above-mentioned construction, since the first and second insulating protective layers are made of solder resist whose young's modulus is set in the range of 5 kgf/mm² to 70 kgf/mm², the liquid crystal display is allowed to have a tape carrier package semiconductor device with high flexibility.

Therefore, for example, even if the tape carrier package semiconductor devices are packaged on a liquid crystal panel display, the metal wiring pattern is not susceptible to disconnection. Further, the warping in the tape carrier package semiconductor devices is suppressed, and the manufacturing yield of the liquid crystal panel display can be improved.

Moreover, the testing method for disconnection of the present invention, which is a testing method for disconnection in a tape carrier which constitutes a tape carrier package semiconductor device and in which a metal wiring pattern and an insulating protective film for insulating and coating the metal wiring pattern are placed on an insulating tape, is characterized by the steps of: manufacturing a testing tape carrier having a construction identical to the tape carrier; connecting both of the ends of the testing tape carrier to plate-shaped substrates; aligning the substrates face to face with each other so that the testing tape carrier is brought into a bent state; and exposing the testing tape carrier to temperature environments which change with a predetermined cycle so as to count the number of cycles until the metal wiring pattern in the testing tape carrier has been disconnected.

In the above mentioned method that is a testing method for disconnection in the metal wiring pattern of a tape carrier constituting a tape carrier package semiconductor device, a testing tape carrier having a construction identical to the tape carrier is manufactured, and this is brought into a bent state with the liquid crystal panel and the circuit board being aligned face to face with each other, and in this state, the testing tape carrier is exposed to temperature environments which change with a predetermined cycle so as to find the number of cycles until it has been disconnected.

By bringing the testing tape carrier into the above-mentioned bent state, it becomes possible to create a state close to the state in which the tape carrier package semiconductor device is actually packaged on a liquid crystal panel. When the testing tape carrier is exposed to the temperature environments which change with a predetermined cycle in this state, possible disconnected portions coincide with disconnected portions occurring in an actual liquid crystal panel packaging process, and the occurrence of the possible disconnected portions is accelerated.

Therefore, by carrying out the above-mentioned test for disconnection, it becomes possible to positively confirm defects due to disconnection occurring in the liquid crystal panel packaging process of the tape carrier package semiconductor device in a short time.

For a fuller understanding of the nature and advantages of the invention, reference should be made to the ensuing detailed description taken in conjunction with the accompanying drawings.

BRIEF DESCRIPTION OF THE DRAWINGS

FIG. 1(a) is a plan view showing a schematic construction of a tape carrier package semiconductor device in accordance with one embodiment of the present invention, and FIG. 1(b) is a cross-sectional view taken along line C–C' of FIG. 1(a).

FIG. 2 is a flow chart that explains processes for manufacturing the tape carrier package semiconductor device.

FIG. 6 is an enlarged cross-sectional view that shows one portion of a liquid crystal panel display using the tape carrier package semiconductor device.

FIG. 7(a) is a plan view that shows a schematic construction of a conventional tape carrier package semiconductor device, and FIG. 7(b) is a cross-sectional view taken along line A–A' of FIG. 7(a).

FIG. 8 is a flow chart that explains processes for manufacturing a tape carrier used in the tape carrier package semiconductor device shown in FIGS. 7(a) and 7(b).

FIG. 9(a) is a cross-sectional view that shows a schematic construction of another conventional tape carrier package semiconductor device, and FIG. 9(b) is a cross-sectional view taken along line B–B' of FIG. 9(a).

FIG. 10 is a flow chart that explains processes for manufacturing a tape carrier used in the tape carrier package semiconductor device shown in FIGS. 9(a) and 9(b).

FIG. 12(a) is an enlarged cross-sectional view that shows one portion of a liquid crystal panel display in which the tape carrier package semiconductor device, shown in FIGS. 7(a) and 7(b), has been packaged, and FIG. 12(b) is an enlarged cross-sectional view that shows one portion of a liquid crystal panel display in which the tape carrier package semiconductor device, shown in FIGS. 11(a) and 11(b), has been packaged.

FIGS. 13(a) and 13(b) are explanatory drawings that show a conventional disconnection-detecting method.

DESCRIPTION OF THE EMBODIMENTS

[EMBODIMENT 1]

Figure 3:
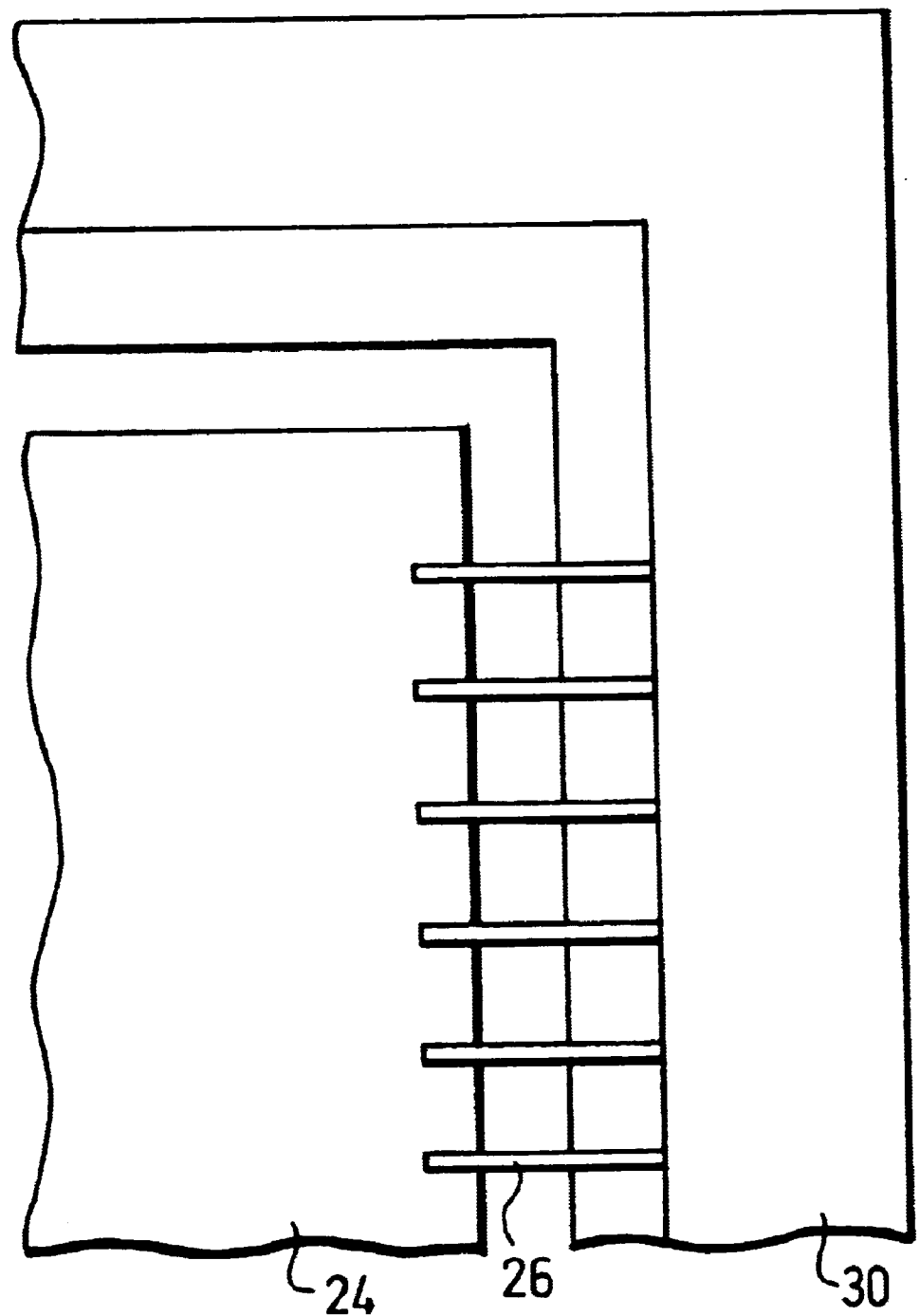
FIG. 3 is a drawing that shows one portion of the upper surface of the tape carrier package semiconductor device in an enlarged manner.
Figure 4:
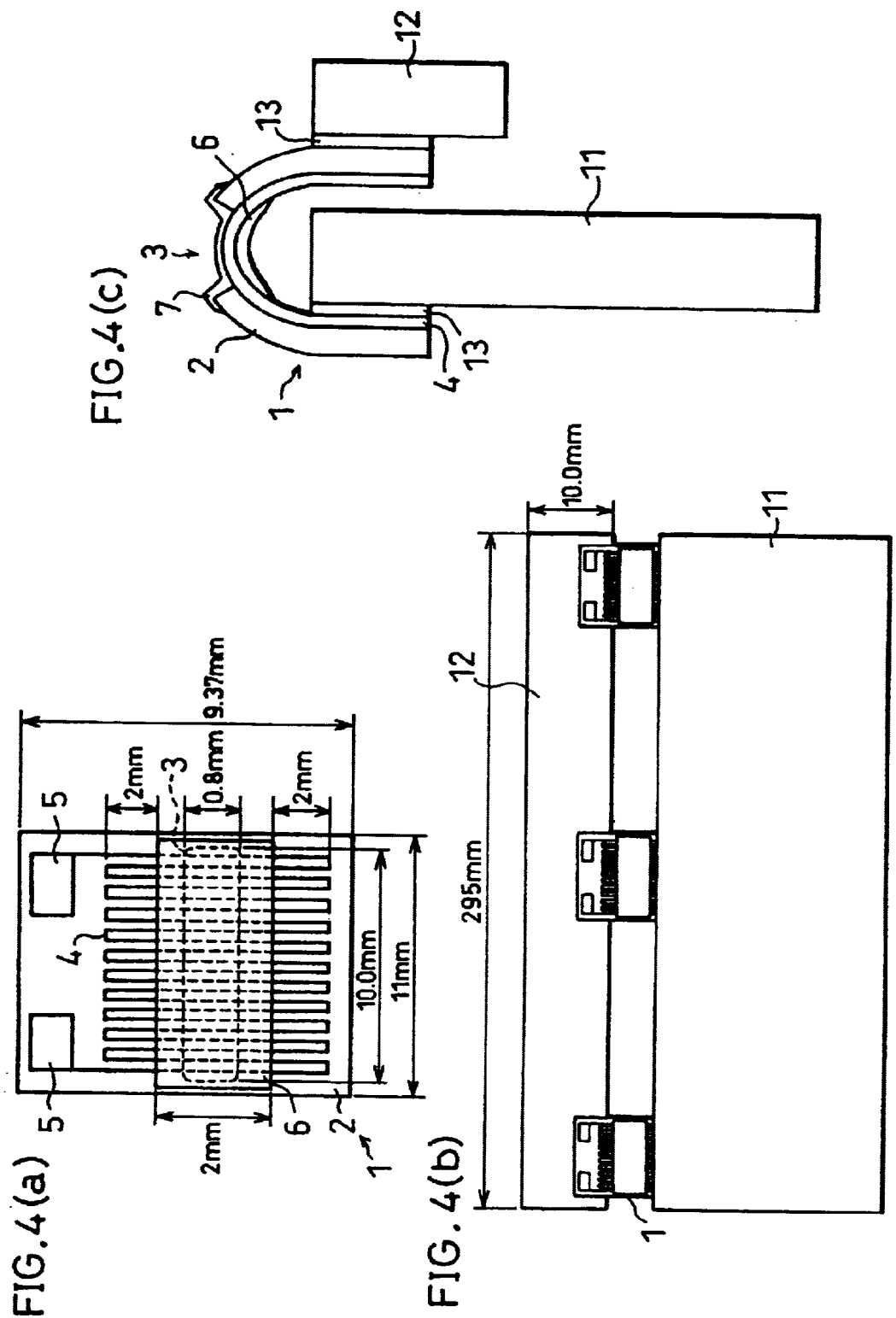
FIGS. 4(a) through 4(c) are explanatory drawings that show a testing method for disconnection in the tape carrier package semiconductor device.

Referring to FIGS. 1 through 5, the following description will discuss a tape carrier package semiconductor device in accordance with one embodiment of the present invention.

Prior to manufacturing a TCP semiconductor device (a tape carrier package semiconductor device) of the present embodiment, a check was made for an optimal construction of the TCP semiconductor device by producing TEG 1 that is a testing pattern as shown in FIG. 4(a) and carrying out a test for disconnection.

TEG 1 is constituted by a polyimide substrate 2 serving as an insulating tape, a slit 3, a copper wiring pattern 4 provided as a metal wiring pattern, a pair of electrode pads 5 and solder resist 6 that is formed on the copper wiring pattern 4 as an insulating protective film. Further, the back side of the slit 3 is coated with solder resist 7 made of a polyimide material as illustrated in FIG. 4(c).

The dimensions of the main part of TEG 1 are shown in FIG. 4(a); however, they are not intended to be limited by those figures, and altered appropriately in accordance with the dimensions of a TCP semiconductor device that is an actual device corresponding to TEG 1. Here, upon forming TEG 1, factors, such as a kind and thickness of copper foil used as the copper wiring pattern 4, a kind and thickness of a bonding agent for bonding the polyimide substrate 2 and copper foil, a kind and thickness of the solder resist 6 and the dimension of the slit 3, are set to be equal to those of the TCP semiconductor device that is actually used. In particular, electrolytic copper foil is used as the copper foil with a thickness of 15 to 18 μm, the width of the wiring pattern is set at 35 μm, and the wiring pattern pitch is set at 70 μm. Moreover, #7100 (Brand Name) made by Toray Industries Inc. is used as the bonding agent.

The electrode pads 5 are installed so that upon disconnection of the copper wiring pattern 4, the disconnection is immediately confirmed. In order to confirm defects due to disconnection, it is only necessary to allow an open checker to contact the electrode pads 5 after the test for disconnection.

Here, for the purpose of simplifying the processes, the assembly of driver IC chips to TEG 1 is omitted.

Next, as illustrated in FIGS. 4(b) and 4(c), three TEGs 1, each having the above-mentioned construction, are connected to a liquid crystal panel 11 and a PWB 12, and then bent. The connecting process is explained as follows:

First, ACF 13 is temporarily press-bonded to the liquid crystal panel 11. In this temporary press-bonding, a tool, heated to 90° C., is pressed onto ACF 13 that is an anisotropic conductive bonding agent for two seconds with a load of 10 kgf/cm². Then, spacers adhering to ACF 13 are separated, and TEGs 11 are aligned and temporarily press-bonded thereto. This temporary press-bonding process is carried out under the same conditions as the above-mentioned temporary press-bonding process. Next, TEGs 1 and the liquid crystal panel 11 are actually press-bonded to each other by pressing a tool heated to 200° C. onto TEGs 1 for 20 seconds with a load of 35 kgf/cm².

The liquid crystal panel 11 has a screen size of 13.8 inches, and is manufactured by using glass having a thickness of 1.1 mm. Here, all the press-bonding devices are commercially available.

Next, ACF 13 is joined to the PWB 12. In this case, ACF 13 is temporarily press-bonded thereto under the same conditions as those in the liquid crystal panel 11. Thereafter, the spacers of ACF 13 are separated, TEGs 1 and the PWB 12 are aligned, and all the TEGs 1 are actually press-bonded as one lot. The thickness of the PWB 12 is 0.5 mm.

After TEGs 1 have been joined to the liquid crystal panel 11 and the PWB 12, the liquid crystal panel 11 and the PWB 12 are aligned face to face with each other with a predetermined distance so that TEGs 1 are bent; thus, several samples used for tests for disconnection are produced. FIG. 4(c) shows the side view of this sample.

Tests for disconnection in the copper wiring pattern 4 were carried out by putting the sample into a temperature-cycling vessel in the above-mentioned bent state. The temperature-cycling vessel was set so that two temperatures, 85° C. and −30° C., were respectively repeated for 30 minutes; thus, one cycle (period) is counted as one hour. These samples were produced by using various kinds of solder resist as the solder resist 6 formed on the copper wiring pattern 4, and tested under the testing method for disconnection. Table 1 shows one example of the results of the number of cycles counted until disconnection occurred in each of the samples.

[Table 1]

Refer to "Table 1" on attached page 63.

The samples that were subjected to the tests used the following solder resists as the solder resist 6: TEG (Sample 1) using an epoxy solder resist having a young's modulus of 200 kgf/mm²; TEG (Sample 2) in which pieces of an epoxy solder resist having a young's modulus of 380 kgf/mm² are formed on both of the sides of a polyimide solder resist having a young's modulus of 50 kgf/mm²; TEG (Sample 3) using a polyimide solder resist having a young's modulus of 15 kgf/mm²; TEG (Sample 4) using a urethane solder resist having a young's modulus of 33 kgf/mm²; and TCP semiconductor device (Sample 5) in which an epoxy solder resist having a young's modulus of 200 kgf/mm² is formed.

Here, different from TEGs of Samples 1 through 4, Sample 5 is a TCP semiconductor device which is actually used in a liquid crystal panel display. Further, the thickness of solder resist is all set at 25 μm.

In table 1, with respect to the fractions shown in the frame of the number of temperature cycles up to disconnection, the denominator represents the number of samples that were tested, and the numerator represents the number of samples that suffered disconnection. First, all the portions suffering disconnection coincided with those in the TCP semiconductor device that served as an actual device. Moreover, since sample 5 suffered disconnection at 500 cycles while sample 1 suffered disconnection at 20 cycles, it was found that the acceleration factor in the testing method for disconnection of the present embodiment is 25 times. Therefore, the testing method for disconnection makes it possible to simulate the disconnection mode of the actual device in a short period.

Here, with respect to practical resistance to disconnection, it is required that no disconnection occurs within 200 cycles; and Table 1 shows that samples 3 and 4 satisfy this requirement. Moreover, the results show that the smaller the young's modulus of solder resist, the fewer the number of occurrences of disconnection. Additionally, in sample 2 bleeding occurred during the test, resulting in degradation in the patterning precision. Therefore, it is necessary to select a solder resist which is free from bleeding while ensuring resistance to disconnection.

In order to find conditions of such a solder resist, a sample whose filler amount, which determines the thixotropy, was varied was manufactured as solder resist 6, and tests for disconnection were carried out. As a result, it was found that the application of solder resist whose filler amount is in the range of 10 wt % to 40 wt % makes it possible to achieve both the resistance to disconnection and the prevention of bleeding even up to not less than 200 cycles.

In the case of solder resist whose filler amount is less than 10 wt %, considerable bleeding occurs upon receipt of not less than 500 cycles in the test for disconnection, and in the case of solder resist whose filler amount is greater than 40 wt %, the young's modulus increases, resulting in degradation in the flexibility of the solder resist and causing disconnection even within 200 cycles. The solder resist whose filler amount was in the range of 10 wt % to 40 wt % had a young's modulus in the range of 5 $kgf/mm^2$ to 70 $kgf/mm^2$.

Additionally, in order to set the young's modulus in the range of 5 $kgf/mm^2$ to 70 $kgf/mm^2$, it is effective to set the young's modulus of the main materials consisting of polymerizing ingredients in the solder resist at not more than 1 $kgf/mm^2$.

As the results of the above-mentioned tests for disconnection, it is found that the application of solder resist whose young's modulus is set in the range of 5 $kgf/mm^2$ to 70 $kgf/mm^2$ and whose filler amount is set in the range of 10 wt % to 40 wt % is effective to produce a TCP semiconductor device that is suitable for practical use.

Moreover, when the young's modulus and filler amount are set within the above-mentioned ranges, the above-mentioned effect can be obtained by merely using one kind of either of rubber, polyimide, epoxy, silicon and urethane solder resists. Moreover, the thickness of the insulating protective film was set at 25 μm in the above-mentioned tests for disconnection; however, it is also found that, not limited to this figure, the same effect can be obtained by setting the thickness in the range of 5 μm to 45 μm.

Next, Table 2 shows the results of tests for resistance to disconnection carried out by using the MIT testing method as comparative examples for the testing method for disconnection in accordance with the above-mentioned embodiment.

TABLE 2

| | Kinds of Solder Resist | Number of Bending in the MIT test |
|---|---|---|
| 1' | TEG using epoxy solder resist | 38 |
| 2' | TEG using epoxy and polyimide solder resists | 24 |
| 3' | TEG using polyimide solder resist | 72 |
| 4' | TEG using urethane solder resist | 62 |

N = the average number of disconnections on 10 pieces

The samples that were subjected to the tests used the following TEGs: TEG (Sample 1') using an epoxy solder resist having a young's modulus of 200 $kgf/mm^2$; TEG (Sample 2') in which pieces of an epoxy solder resist having a young's modulus of 380 $kgf/mm^2$ are formed on both of the sides of a polyimide solder resist having a young's modulus of 50 $kgf/mm^2$; TEG (Sample 3') using a polyimide solder resist having a young's modulus of 15 $kgf/mm^2$; and TEG (Sample 4') using a urethane solder resist having a young's modulus of 33 $kgf/mm^2$. Ten pieces of each of the samples were manufactured, and with respect to these samples, the average value of the number of bents up to disconnection was calculated.

The respective TEGs are different in shape from TEG 1 in the testing method for disconnection in the present embodiment; however, with respect to the kinds of solder resists, samples 1' through 4' respectively correspond to samples 1 through 4.

In the MIT testing method, portions suffering disconnection were limited to those portions on the copper wiring pattern formed over the slits, and the results showed that the portions suffering disconnection did not coincide with those in the TCP semiconductor device that served as an actual device. Moreover, the results showed that sample 1' has higher resistance to disconnection than sample 2', which is reversed to the fact in the testing method for disconnection in the present embodiment that sample 2 has higher resistance to disconnection than sample 1.

This indicates that although sample 1' has better results than sample 2' in the MIT testing method with fewer cases of cracking and alligatoring in solder resist upon bending, when the solder resist is actually applied to TCP semiconductor devices so as to be packaged on a liquid crystal panel and a PWB, those devices using the solder resist of sample 1' are more susceptible to disconnection than those using the solder resist of sample 2'.

In this manner, the MIT testing method fails to simulate the disconnection mode in the actual device.

Moreover, in the testing method for disconnection in the present embodiment, samples were manufactured in which with respect to solder resist 6 (hereinafter, referred to region p) formed on the surface of the slit 3 and the copper wiring pattern 4 and solder resist 7 (hereinafter, referred to region q) formed on the back side of the slit 3, various kinds of solder resists were used, these samples were subjected to tests under the testing method for disconnection, and the number of cycles at which disconnection occurred was calculated in the respective samples. Table 3 shows one example of the results of the tests.

[Table 3]

Refer to "Table 3" on attached page 64.

The samples that were subjected to the tests used the following TEGs: TEG (Sample 1) in which an epoxy solder resist having a young's modulus of 200 $kgf/mm^2$ is formed on region p while a polyimide solder resist having a young's modulus of 50 $kgf/mm^2$ is formed on region q; TEG (Sample 2) in which pieces of an epoxy solder resist having a young's modulus of 380 $kgf/mm^2$ are formed on the sides of a polyimide solder resist having a young's modulus of 50 $kgf/mm^2$ in a sandwiched manner at region p while a polyimide solder resist having a young's modulus of 50 $kgf/mm^2$ is formed on region q; TEG (Sample 3) in which pieces of a polyimide solder resist having a young's modulus of 15 $kgf/mm^2$ are formed on both of regions p and q; TEG (Sample 4) in which a polyimide solder resist having a young's modulus of 15 $kgf/mm^2$ is formed on region p while a urethane solder resist having a young's modulus of 38 kgf/mm² is formed on region q; TEG (Sample 5) in which pieces of a urethane solder resist having a young's modulus of 38 kgf/mm² are formed on both of regions p and q; TEG (Sample 6) in which pieces of a silicon solder resist having a young's modulus of 42 kgf/mm² are formed on both of regions p and q; and a TCP semiconductor device (Sample 7) in which an epoxy solder resist having a young's modulus of 200 kgf/mm² is formed on region p while a polyimide solder resist having a young's modulus of 50 kgf/mm² is formed on region q.

Here, different from TEGs of Samples 1 through 6, Sample 7 is a TCP semiconductor device which is actually used in a liquid crystal panel display. Further, the thickness of solder resist is all set at 25 μm.

In table 3, with respect to the fractions shown in the frame of the number of temperature cycles up to disconnection, the denominator represents the number of samples that were tested, and the numerator represents the number of samples that suffered disconnection in the same manner as Table 1.

First, all the portions suffering disconnection coincided with those in the TCP semiconductor device that served as an actual device. Moreover, since sample 7 suffered disconnection at 500 cycles while sample 1 suffered disconnection at 20 cycles, it was found that the acceleration factor in the testing method for disconnection of the present embodiment is 25 times. Therefore, the testing method for disconnection makes it possible to simulate the disconnection mode of the actual device in a short period.

Here, with respect to practical resistance to disconnection, it is required that no disconnection occurs within 200 cycles in TEGs; and Table 3 shows that samples 3 through 6 satisfy this requirement. Moreover, the results show that the application of solder resist having a smaller young's modulus to both of regions p and q makes the device less susceptible to disconnection.

For example, sample 1 suffered disconnection at 20 cycles and sample 2 suffered disconnection at 250 cycles; however, samples 3 and 4 did not suffer disconnection even at 700 cycles. Moreover, in sample 2, bleeding occurred during the test, resulting in degradation in the patterning precision. Therefore, it is necessary to select a solder resist which is free from bleeding while ensuring resistance to disconnection.

In order to find conditions of such a solder resist, samples whose inorganic filler amount such as $SiO_2$ amount, which determines the thixotropy, was varied were manufactured as solder resists 6 and 7, and tests for disconnection were carried out. As a result, it was found that the application of solder resist whose filler amount is greater than 5 wt % makes it possible to suppress bleeding to not more than 100 μm although the application of solder resist whose filler amount is not more than 5 wt % causes bleeding of not less than 200 μm.

Moreover, it was also found that the application of solder resist whose filler amount is set in the range of 10 wt % to 40 wt % prevents disconnection even at not less than 200 cycles so that the occurrence of bleeding can be prevented. At this time, the young's modulus of the solder resist was in the range of 5 kgf/mm² to 70 kgf/mm². Here, in order to set the young's modulus in the range of 5 kgf/mm² to 70 kgf/mm², it is effective to set the young's modulus of the main materials consisting of polymerizing ingredients in the solder resist at not more than 1 kgf/mm².

As the results of the above-mentioned tests for disconnection, it is found that when solder resist whose young's modulus is set in the range of 5 kgf/mm² to 70 kgf/mm² and whose filler amount is set in the range of 10 wt % to 40 wt % is applied to regions p and q, that is, applied as solder resist 6 and 7, a TCP semiconductor device that is immune from disconnection upon packaging and suitable for practical use can be produced.

Moreover, when the young's modulus and filler amount are set within the above-mentioned ranges, the above-mentioned effect can be obtained by merely applying one kind of either of rubber, polyimide, epoxy, silicon and urethane solder resists to each of regions p and q. Moreover, the thickness of the insulating protective film was set at 25 μm in the above-mentioned tests for disconnection; however, it was also found that, not limited to this figure, the same effect can be obtained by setting the thickness in the range of 5 μm to 45 μm.

The following description will discuss a TCP semiconductor device that is manufactured based upon the above-mentioned results of the tests for disconnection.

FIG. 1(a) is a plan view that shows a schematic construction of a flex TCP semiconductor device 21 serving as a tape carrier package semiconductor device, and FIG. 1(b) is a cross-sectional view taken along line C–C' of FIG. (a).

The flex TCP semiconductor device 21 has a construction in which a driver IC chip 24 serving as a semiconductor element is electrically connected to a tape carrier 23 formed by using a polyimide substrate 22 serving as an insulating tape.

The tape carrier 23 is constituted by a copper wiring pattern that serves as a metal wiring pattern and that consists of a pair of slits 25 that are through holes, inner leads 26, outer leads 27 on the input side, outer leads 28 on the output side and a test pad 29, solder resist 30 and pieces solder resist 31 serving as insulating protective films for insulating and covering the slits 25 and the copper wiring pattern, and sprocket holes 32 that are used for leading and positioning the polyimide substrate 22.

Moreover, the driver IC chip 24 is electrically connected to the inner leads 26 through Au bumps 33, and the proximity of the connecting section is sealed by resin 34.

Referring to FIG. 2, an explanation will be given of manufacturing processes of the tape carrier 23 in the flex TCP semiconductor device 21 having the above-mentioned construction.

First, the surface of the polyimide substrate 22 (Upilex: Trademark of Ube Industries, Ltd.) is coated with a bonding agent (process 1), a device hole, a pair of slits 25 and sprocket holes 32 are formed by punching out the polyimide substrate 22 with a die (process 2).

Next, the polyimide substrate 22 is laminated with copper foil having a thickness of either 18 μm, 25 μm or 35 μm (process 3). Moreover, pieces of solder resist 31, each having a thickness of 25 μm, are formed over the pair of slits 25 from the side opposite to the surface on which the copper wiring pattern is to be formed later, and subjected to a curing process for 60 minutes at 150° C. (process 4).

Then the copper-foil surface is coated with photoresist serving as an etching mask (process 5). Further, the photoresist is printed as a desired pattern through exposure (process 6), and developed (process 7). Here, photoresist serving as an etching mask is also formed over the device hole (process 8). Thereafter, the desired copper wiring pattern is formed by dipping the entire copper foil into a copper-foil etching liquid (process 9). After the copper wiring pattern has been formed in this manner, all the photoresist is separated by an organic solvent or dry etching (process 10).

Next, on the surface of the polyimide substrate 22 on which the copper wiring pattern has been formed, solder resist 30, made of the same material as pieces of solder resist 31 formed in process 4, is printed in a manner so as to cover the slits 25 that form bending portions, and is subjected to a curing process for approximately two hours (process 11).

Next, tin plating is applied to the surface of the exposed copper foil by the electroless plating method with a thickness of approximately 0.2 µm to 0.6 µm. Further, this tin plating is subjected to a curing process so as to prevent the occurrence of whisker (process 12).

Next, a driver IC chip 24 is connected to the inner leads 26 of the tape carrier 23 that has been manufactured in the above-mentioned processes through Au bumps 33 (process 13). Then, the proximity of these connecting portions is sealed by resin 34 (process 14), thereby completing a flex TCP semiconductor device 21.

Figure 5:
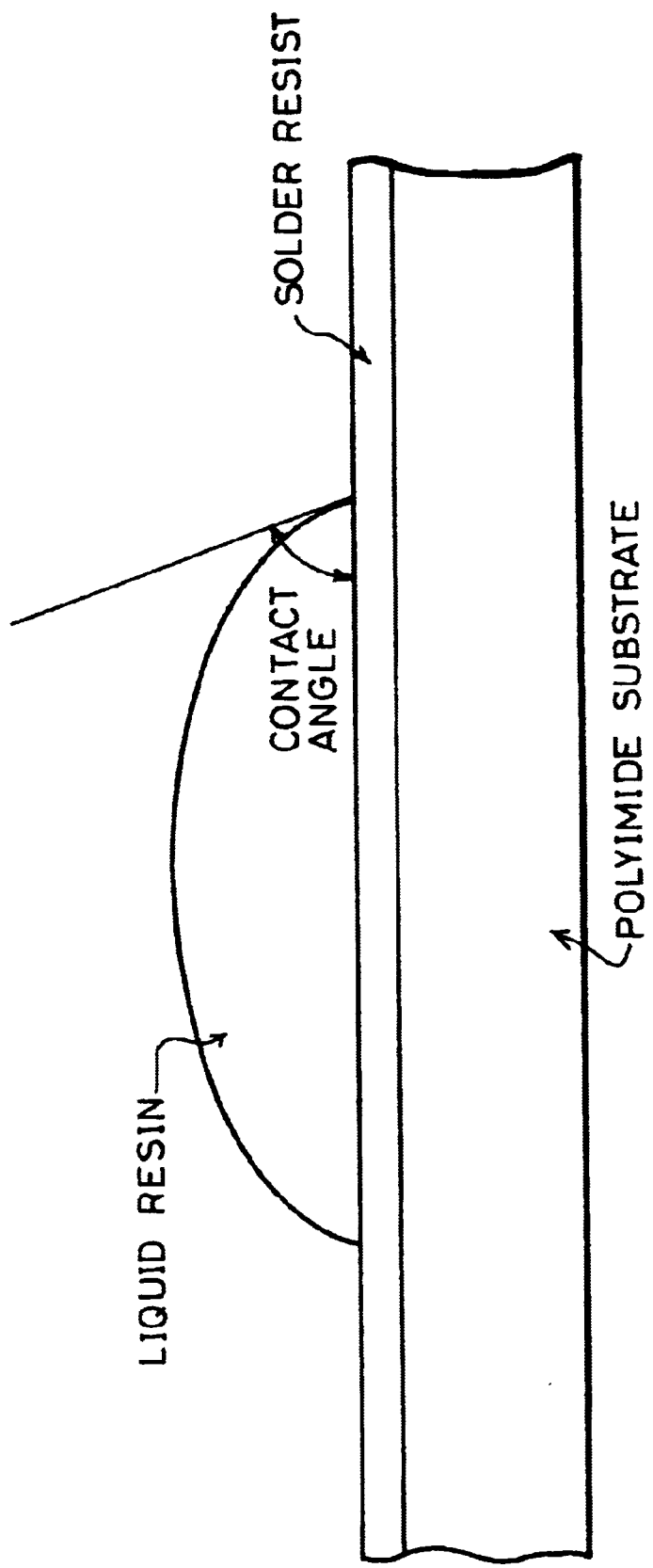
FIG. 5 is an explanatory drawing that shows an adhering property of solder resist to a liquid resin in the tape carrier package semiconductor device.
Figure 11A:
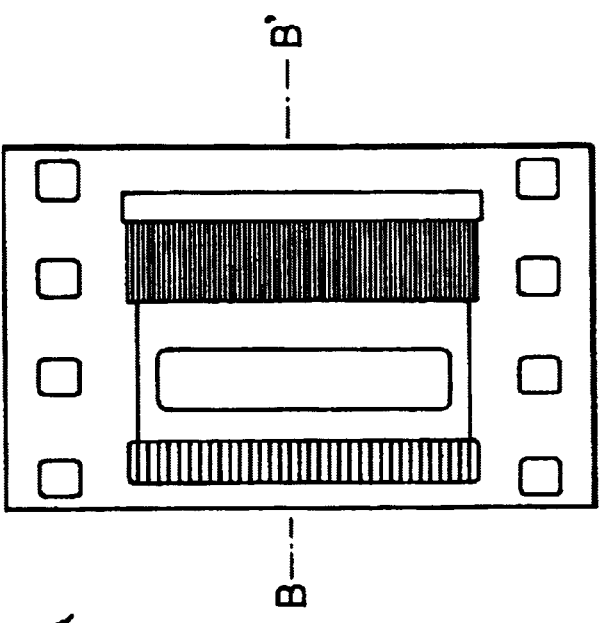
FIG. 11(a) is a plan view that shows a schematic construction of a conventional straight-type tape carrier package semiconductor device without slits.
Figure 11B:
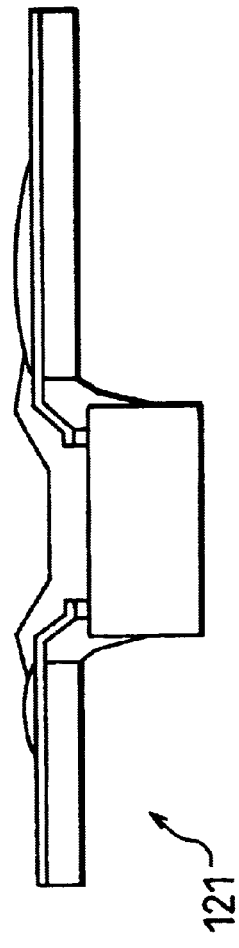
FIG. 11(b) is a cross-sectional view taken along line B–B' of FIG. 11(a).

In process 14 for carrying out the resin sealing, the resin 34 is formed in a manner so as to cover the edge portion of the polyimide solder resist 30. At this time, the problem is the adhesion between the resin 34 and the polyimide solder resist 30. Examination on the correlation between the change in solvent ingredients in the liquid resin and the adhesion has revealed that when silicon etc. is mixed thereto as a leveling agent so that the solvent ingredients are set at not more than 10 wt %, the contact angle at which the liquid resin adhesion to the polyimide solder resist becomes not more than 700 as shown in FIG. 5, thereby providing better adhesion. In addition, even if the solvent ingredients are reduced in this manner, the resin can be poured into a desired position.

Moreover, even when any of rubber, epoxy, silicon, and urethane solder resists is used as the insulating protective film, better adhesion is obtained in the case of the contact angle of the liquid resin of not more than 700.

Therefore, when the resin 34 is formed in process 14 so as to have a contact angle of not more than 700 to the polyimide solder resist 30, it becomes possible to improve the manufacturing yield of the flex TCP semiconductor device 21.

In process 4 and process 11, any of rubber, polyimide, epoxy, silicon and urethane solder resists may be used as the above-mentioned solder resist 31 as long as it has a young's modulus in the range of 5 kgf/mm$^2$ to 70 kgf/mm$^2$ and a filler amount in the range of 10 wt % to 40 wt %. For example, such a main agent which has a young's modulus of not more than 1 kgf/mm$^2$ even after having been cured is selected, and polyimide solder resist, which has been made by mixing a filler whose amount is 38 wt % with the main agent, may be applied. In this case, the young's modulus is set at 16 kgf/mm$^2$ after cure. This corresponds to B in the pencil hardness.

Figure 14:
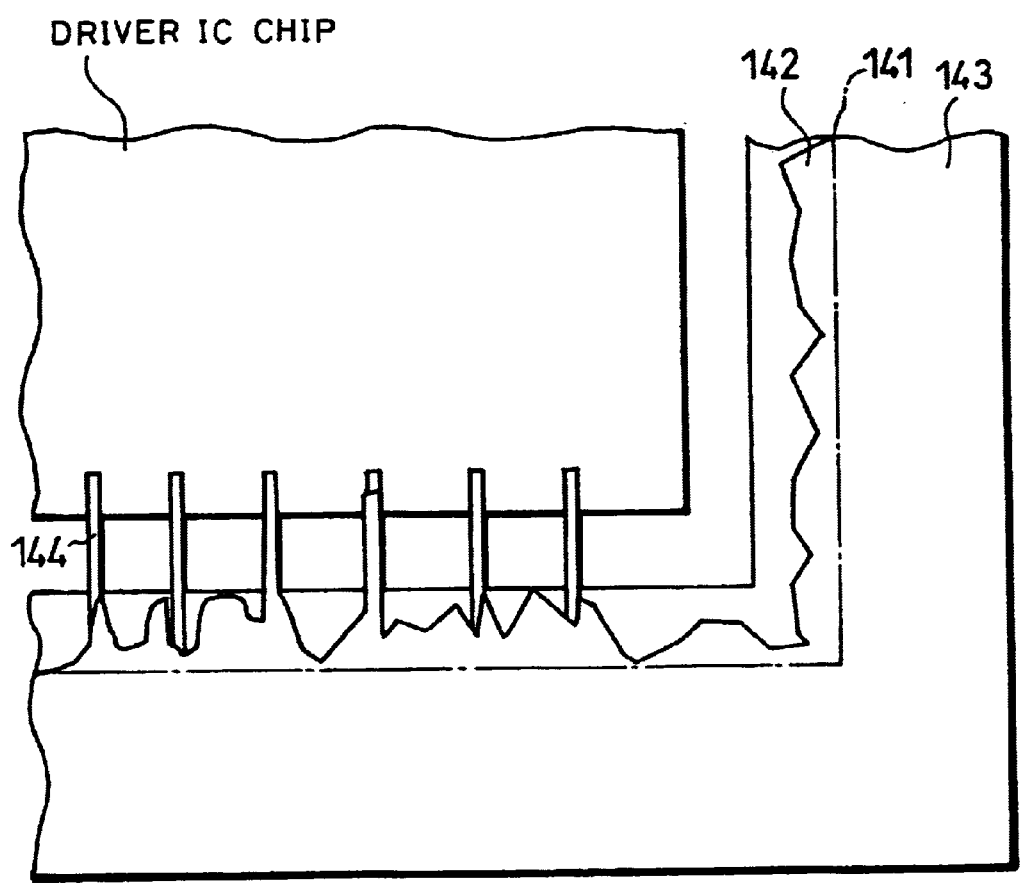
FIG. 14 is a drawing that shows one portion of the upper surface of a conventional tape carrier package semiconductor device that has been subjected to bleeding.
Figure 15:
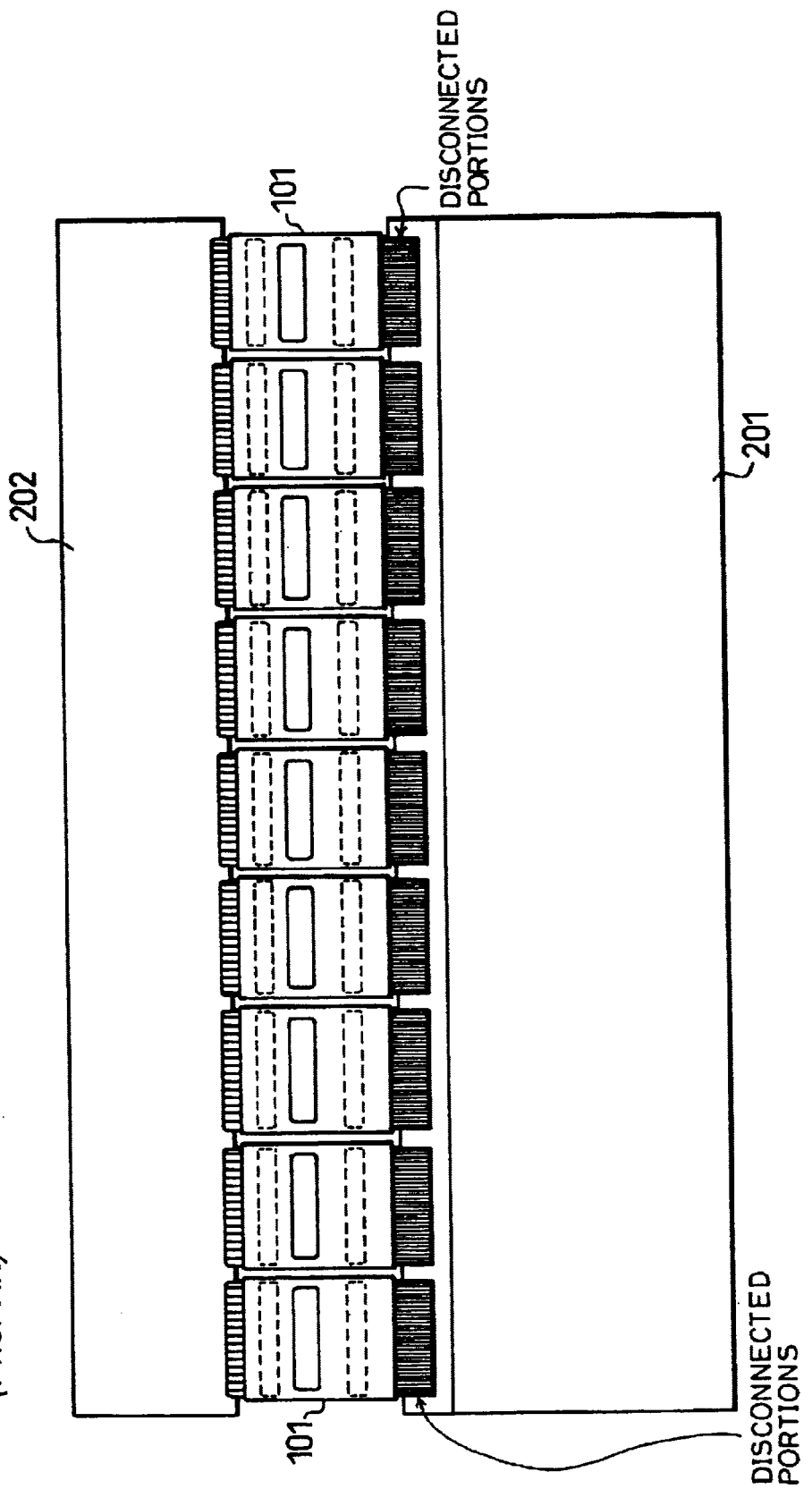
FIG. 15 is a plan view that shows disconnected portions occurring in a liquid crystal panel display device in which the tape carrier package semiconductor device, shown in FIGS. 7(a) and 7(b), has been packaged.

The application of such solder resist 31 makes the copper wiring pattern less susceptible to disconnection. FIG. 3, which is an enlarged view that shows one portion of the upper surface of the flex TCP semiconductor device 21 in an enlarged manner, indicates that no occurrence of bleeding and no separation of solder resist are seen as compared with FIG. 14; thus, it is possible to improve the patterning precision to ±0.2 mm. Consequently, it becomes possible to improve the manufacturing yield of the tape carrier 23 by approximately 2 W.

Moreover, since the warping of the flex TCP semiconductor device 21 is suppressed to not more than 1 mm, it is possible to smoothly transport the flex TCP semiconductor device 21 in the succeeding assembling process.

Furthermore, the same device for forming solder resist may be used in both process 4 and process 11; therefore, the production costs of the flex TCP semiconductor device 21 can be reduced.

With the above-mentioned arrangement, since the formation of the solder resist is made only once, the number of days in manufacturing the tape carrier 23 can be shortened by one day, as compared with the case in which the formation of solder resist is carried out twice, thereby greatly contributing to the so-called QTAT (Quick Turn Around Time). In addition, the manufacturing cost of the tape carrier 23 can be suppressed by 10 to 20%.

Additionally, in process 4 and process 11, the same solder resist is formed; however, the present invention is not intended to be limited to this arrangement, and different kinds of solder resists may be used in the respective processes, as long as they have a young's modulus in the range of 5 kgf/mm$^2$ to 70 kgf/mm$^2$ and a filler amount in the range of 10 wt % to 40 wt %.

[EMBODIMENT 2]

Referring to FIG. 6, the following description will discuss one embodiment of a liquid crystal panel display of the present invention. Here, for convenience of explanation, those members that have the same functions and that are described in embodiment 1 are indicated by the same reference numerals and the description thereof is omitted.

As illustrated in FIG. 6, the liquid crystal panel display 51 of the present embodiment is constituted by the flex TCP semiconductor devices 21 that have been described in Embodiment 1, a liquid crystal panel 52, a PWB 53, a backlight 54 and a vessel 55.

Here, in this case, the driver IC chip 24 of the flex TCP semiconductor device 21 functions as a driving semiconductor element.

The following description will discuss manufacturing processes of the liquid crystal panel display 51.

First, an ACF is temporarily press-bonded onto a liquid crystal panel 52. The ACF, which has some kinds in width ranging from 1.2 mm to 3 mm, is properly selected so as to fit the size of the frame edge of the liquid crystal panel 52. Therefore, for example, if the width of the frame edge is narrow, an ACF with a narrow width is selected. Upon temporarily press-bonding the ACF, while the ACF is being affixed onto the liquid crystal panel 52, a tool, heated to 90° C., is pressed thereon for approximately 2 seconds. At this time, the ACF reacts due to the heat and is cured, but is not completely cured so that an actual press-bonding process can be carried out later.

Upon completion of the temporary press-bonding process of the ACF, spacers, which have adhered to the ACF, are separated, and outer leads 28 on the output side of the flex TCP semiconductor devices 21 are temporarily press-bonded thereto. In this case, the flex TCP semiconductor devices 21 and the liquid crystal panel 52 are positioned by using alignment marks that have been respectively formed thereon. Prior to this temporary press-bonding process, the flex TCP semiconductor devices 21, which are connected in a reel shape, are punched out into respective pieces by using a die. Then upon temporarily press-bonding, a tool, heated to 100° C., is pressed thereon with a load of 10 kgf/cm$^2$ for 3 seconds; however, the ACF is not completely cured.

After the temporary press-bonding process of the flex TCP semiconductor devices 21, the actual press-bonding process is carried out. In the actual press-bonding process, a tool, heated to 200° C., is pressed with a load of 35 kgf/cm² for 20 seconds onto all the flex TCP semiconductor devices 21 at one time.

After the flex TCP semiconductor devices 21 have been packaged onto the liquid crystal panel 52, outer leads 27 on the input side of the flex TCP semiconductor devices 21 are joined to the PWB 53. With respect to the packaging method of the flex TCP semiconductor devices 21 onto the PWB 53, a soldering method and a method using an ACF are proposed. In the packaging method by using the ACF, all the flex TCP semiconductor devices 21 are packaged at one time onto the PWB 53 which has been aligned.

Thereafter, the backlight 54 serving as a light source is assembled on the back side of the liquid crystal panel 52, and the entire unit consisting of the liquid crystal panel 52, the PWB 53 and the backlight 54 is covered with the vessel 55.

The liquid crystal panel display 51 is manufactured as described above. The flex TCP semiconductor device 21, which has high resistance to disconnection and is superior in the manufacturing yield as described earlier, is used in the liquid crystal panel display 51. Therefore, even a large-size liquid crystal panel display of not less than 10 inches can be manufactured with high yield at low costs.

As described above, the testing method for disconnection of the present invention, which is a testing method for disconnection in a testing tape carrier which has a construction identical to that of a tape carrier of a tape carrier package semiconductor device having driving semiconductor elements for driving the liquid crystal panel each of which is provided with the tape carrier in which a metal wiring pattern and an insulating protective film for insulating and coating the metal wiring pattern are placed on an insulating tape, is characterized in that: one end of the testing tape carrier is connected to the liquid crystal panel with the other end being connected to a circuit board for releasing a signal for driving the liquid crystal panel; the liquid crystal panel and the circuit board are aligned face to face so that the testing tape carrier is brought into a bent state; and the testing tape carrier is exposed to temperature environments which change with a predetermined cycle so as to count the number of cycles until the metal wiring pattern in the testing tape carrier has been disconnected.

In the above-mentioned method that is a testing method for disconnection in the metal wiring pattern of a tape carrier constituting a tape carrier package semiconductor device, a testing tape carrier having a construction identical to the tape carrier is manufactured, and this is brought into a bent state with the liquid crystal panel and the circuit board being aligned face to face with each other, and in this state, the testing tape carrier is exposed to temperature environments which change with a predetermined cycle so as to find the number of cycles until it has been disconnected.

By bringing the testing tape carrier into the above-mentioned bent state, it becomes possible to create a state close to the state in which the tape carrier package semiconductor device is actually packaged on a liquid crystal panel. When the testing tape carrier is exposed to the temperature environments which change with a predetermined cycle in this state, possible disconnected portions coincide with disconnected portions occurring in an actual liquid crystal panel packaging process, and the occurrence of the possible disconnected portions is accelerated.

Therefore, by carrying out the above-mentioned test for disconnection, it becomes possible to positively confirm defects due to disconnection occurring in the liquid crystal panel packaging process of the tape carrier package semiconductor device in a short time.

Moreover, the tape carrier package semiconductor device of the present invention, which is a tape carrier package semiconductor device having a tape carrier, in which a metal wiring pattern and an insulating protective film for insulating and coating the metal wiring pattern are placed on an insulating tape, and a driving semiconductor element for driving the liquid crystal panel, with one end of the tape carrier being connected to the liquid crystal panel and the other end being connected to the circuit board for releasing a signal for driving the liquid crystal panel, is characterized in that the insulating protective film is made of a material which has been confirmed by the testing method for disconnection that it makes the testing metal wiring pattern immune from disconnection up to a predetermined number of cycles.

With the above-mentioned construction, the insulating protective film that is to be formed on the tape carrier is made of a material which has been confirmed by the above-mentioned testing method for disconnection that it makes the testing metal wiring pattern immune from disconnection up to a predetermined number of cycles.

Thus, even if the tape carrier package semiconductor devices are packaged on a liquid crystal panel, the metal wiring pattern is less susceptible to disconnection.

Moreover, the above-mentioned tape carrier package semiconductor device is characterized in that the insulating protective film is made of one kind of solder resist which has been confirmed by the testing method for disconnection using cycles in which temperatures of 85° C. and −30° C. are repeated for 30 minutes respectively that it makes the testing metal wiring pattern immune from disconnection up to 200 cycles.

With the above-mentioned arrangement, the insulating protective film formed on the insulating tape is made of one kind of solder resist. The solder resist has such flexibility that it makes the metal wiring pattern immune from disconnection up to 200 cycles, which is confirmed by the test for disconnection in which the solder resist is exposed to temperature environments with a 60-minute cycle in which temperatures of 85° C. and −30° C. are repeated for 30 minutes respectively.

Therefore, even if the tape carrier package semiconductor devices are packaged on a liquid crystal panel, the metal wiring pattern is less susceptible to disconnection. Further, the occurrence of warping in the tape carrier package semiconductor devices is reduced, and since the formation of the insulating protective film is completed by one process, the manufacturing cost of the tape carrier can be reduced.

Moreover, the above-mentioned tape carrier package semiconductor device is characterized in that the solder resist is set to have a young's modulus in the range of 5 kgf/mm² to 70 kgf/mm².

With the above-mentioned arrangement, when its young's modulus is set in the range of 5 kgf/mm² to 70 kgf/mm², the solder resist functions as a very flexible insulating protective film.

Therefore, even if the tape carrier package semiconductor devices are packaged on a liquid crystal panel, the metal wiring pattern is hardly susceptible to disconnection. Further, the occurrence of warping in the tape carrier package semiconductor devices is reduced, and the manufacturing cost of the tape carrier can be reduced.

Furthermore, the above-mentioned tape carrier package semiconductor device is characterized in that the thickness of the solder resist is set in the range of 5 μm to 45 μm.

With the above-mentioned arrangement, when its young's modulus is set in the range of 5 kgf/mm² to 70 kgf/mm² with its thickness being set in the range of 5 μm to 45 μm, the solder resist functions as a very flexible insulating protective film.

The above-mentioned tape carrier package semiconductor device is also characterized in that the solder resist contains a filler that determines the viscosity thereof in the range of 10 wt % to 40 wt %.

With the above-mentioned arrangement, since the solder resist contains a filler in the range of 10 wt % to 40 wt %, the viscosity, upon printing, is maintained low.

Therefore, the thixotropy of the solder resist is improved so that upon printing, the occurrence of bleeding in the edge of the solder resist is reduced, and it becomes possible to improve the patterning precision.

Further, the above-mentioned tape carrier package semiconductor device is characterized in that the solder resist is made of any of rubber, polyimide, epoxy, silicon and urethane solder resists.

With the above-mentioned arrangement, the solder resist, which is any of rubber, polyimide, epoxy, silicon and urethane solder resists, forms a highly flexible insulating protective film.

Moreover, the above-mentioned tape carrier package semiconductor device is characterized in that the periphery of the portions at which the tape carrier and the driving semiconductor elements have been electrically connected is covered with liquid resin having an insulating property in a manner so as to allow the edge of the liquid resin to make an angle of not more than 700 with the upper surface of the solder resist.

In the above-mentioned arrangement, the periphery of the portions at which the tape carrier and the driving semiconductor elements are electrically connected is covered with liquid resin having an insulating property. In this state, the liquid resin is formed in a manner so as to allow its edge to make an angle of not more than 700 with the upper surface of the solder resist.

Thus, the adhesion between the liquid resin and solder resist is improved, and the tape carrier package semiconductor device can be produced with high yield.

Furthermore, the liquid crystal panel display of the present invention, which is a liquid crystal panel display provided with a tape carrier package semiconductor device having a tape carrier, in which a metal wiring pattern and an insulating protective film for insulating and coating the metal wiring pattern are placed on an insulating tape, and a driving semiconductor element for driving the liquid crystal panel, with one end of the tape carrier being connected to the liquid crystal panel and the other end being connected to the circuit board for releasing a signal for driving the liquid crystal panel, is characterized in that the insulating protective film is made of a material which has been confirmed by the testing method for disconnection that it makes the testing metal wiring pattern immune from disconnection up to a predetermined number of cycles.

With the above-mentioned construction, the insulating protective film that is to be formed on the tape carrier is made of a material which has been confirmed by the above-mentioned testing method for disconnection that it makes the testing metal wiring pattern immune from disconnection up to a predetermined number of cycles.

Thus, even if the tape carrier package semiconductor devices are packaged on a large-size liquid crystal panel, the metal wiring pattern is less susceptible to disconnection; therefore, it is possible to provide a large-size liquid crystal panel display with high yield.

Moreover, the above-mentioned tape carrier package semiconductor device is characterized in that the insulating protective film is made of one kind of solder resist which has been confirmed by the testing method for disconnection using cycles in which temperatures of 85° C. and −30° C. are repeated for 30 minutes respectively that it makes the testing metal wiring pattern immune from disconnection up to 200 cycles.

With the above-mentioned arrangement, the insulating protective film formed on the insulating tape is made of one kind of solder resist. The solder resist has such flexibility that it makes the metal wiring pattern immune from disconnection up to 200 cycles, which is confirmed by the test for disconnection in which the solder resist is exposed to temperature environments with a 60-minute cycle in which temperatures of 85° C. and −30° C. are repeated for 30 minutes respectively.

Therefore, even if the tape carrier package semiconductor devices are packaged on a large-size liquid crystal panel, the metal wiring pattern is less susceptible to disconnection. Further, the occurrence of warping in the tape carrier package semiconductor devices is reduced, and since the formation of the insulating protective film is completed by one process, the manufacturing cost of the tape carrier can be reduced.

Consequently, it is possible to provide a large-size liquid crystal panel display with high yield.

Moreover, the above-mentioned liquid crystal panel display is characterized in that the solder resist is set to have a young's modulus in the range of 5 kgf/mm$^2$ to 70 kgf/mm$^2$.

With the above-mentioned arrangement, when its young's modulus is set in the range of 5 kgf/mm$^2$ to 70 kgf/mm$^2$, the solder resist functions as a very flexible insulating protective film.

Therefore, even if the tape carrier package semiconductor devices are packaged on a liquid crystal panel, the metal wiring pattern is hardly susceptible to disconnection. Further, the occurrence of warping in the tape carrier package semiconductor devices is reduced, and the manufacturing cost of the tape carrier can be reduced.

Consequently, it is possible to provide a large-size liquid crystal panel display with high yield.

Furthermore, the above-mentioned liquid crystal panel display is characterized in that the thickness of the solder resist is set in the range of 5 μm to 45 μm.

With the above-mentioned arrangement, when its young's modulus is set in the range of 5 kgf/mm$^2$ to 70 kgf/mm$^2$ with its thickness being set in the range of 5 μm to 45 μm, the solder resist functions as a very flexible insulating protective film.

Therefore, even if the tape carrier package semiconductor devices are packaged on a liquid crystal panel, the metal wiring pattern is less susceptible to disconnection. Further, the occurrence of warping in the TCP semiconductor devices is reduced, and the manufacturing cost of the tape carrier can be reduced.

Consequently, it is possible to provide a large-size liquid crystal panel display with high yield.

The above-mentioned liquid crystal panel display is also characterized in that the solder resist contains a filler that determines the viscosity thereof in the range of 10 wt % to 40 wt %.

With the above-mentioned arrangement, since the solder resist contains a filler in the range of 10 wt % to 40 wt %, the viscosity, upon printing, is maintained low.

Therefore, the thixotropy of the solder resist is improved so that upon printing, the occurrence of bleeding in the edge of the solder resist is reduced, and it becomes possible to improve the patterning precision.

Consequently, it is possible to provide a large-size liquid crystal panel display with high yield.

Further, the above-mentioned liquid crystal panel display is characterized in that the solder resist is made of any of rubber, polyimide, epoxy, silicon and urethane solder resists.

With the above-mentioned arrangement, the solder resist, which is any of rubber, polyimide, epoxy, silicon and urethane solder resists, forms a highly flexible insulating protective film.

Therefore, the metal wiring pattern of the tape carrier package semiconductor device becomes less susceptible to disconnection, and it is possible to provide a large-size liquid crystal panel display with high yield.

Moreover, the above-mentioned liquid crystal panel display is characterized in that the periphery of the portions at which the tape carrier and the driving semiconductor elements have been electrically connected is covered with liquid resin having an insulating property in a manner so as to allow the edge of the liquid resin to make an angle of not more than 700 with the upper surface of the solder resist.

In the above-mentioned arrangement, the periphery of the portions at which the tape carrier and the driving semiconductor elements are electrically connected is covered with liquid resin having an insulating property. In this state, the liquid resin is formed in a manner so as to allow its edge to make an angle of not more than 700 with the upper surface of the solder resist.

Thus, the adhesion between the liquid resin and solder resist is improved, and the tape carrier package semiconductor device can be produced with high yield. Therefore, it is possible to provide a liquid crystal panel display with high yield.

Moreover, the tape carrier package semiconductor device of the present invention, which is a tape carrier package semiconductor device that is provided with a tape carrier having a metal wiring pattern installed on an insulating tape and insulating protective films for insulating and coating the surface and back sides of a through hole formed in the insulating tape so as to allow the insulating tape to bend together with the metal wiring pattern, and a semiconductor element packaged on the tape carrier, is characterized in that the insulating protective films for insulating and coating the surface and back sides of the through hole respectively are made of solder resist whose young's modulus is in the range of 5 kgf/mm$^2$ to 70 kgf/mm$^2$.

In the above-mentioned construction, pieces of the solder resist whose young's modulus is in the range of 5 kgf/mm$^2$ to 70 kgf/mm$^2$ are formed as the insulating protective films for insulating and coating the surface and back sides of the through hole respectively. Thus, the flexibility of the tape carrier package semiconductor device is improved.

Therefore, even when, upon packaging the tape carrier package semiconductor devices on a large-size liquid crystal panel, a great stress is applied to the tape carrier package semiconductor device, the metal wiring pattern is hardly susceptible to disconnection. Further, the warping in the tape carrier package semiconductor device is suppressed, and the manufacturing yield of the tape carrier package semiconductor device can be improved.

Further, the above-mentioned tape carrier package semiconductor device is characterized in that the solder resist is made of the same material on both the surface and back sides of the through hole.

In this arrangement, the solder resist made of the same material is formed on both the surface and back side of the through hole. Since only one kind of solder resist is used, only one dedicated device is required upon forming the solder resist on both the surface and back side of the through hole, and the management of the solder resist is easily carried out.

The above-mentioned tape carrier package semiconductor device is also characterized in that the solder resist contains a filler that determines the viscosity thereof in the range of 10 wt % to 40 wt %.

In the above-mentioned arrangement, the solder resist contains a filler in the range of 10 wt % to 40 wt %. This makes it possible to prevent the occurrence of bleeding upon printing the solder resist, and to improve the patterning precision. Since separation of solder resist is prevented upon manufacturing the tape carrier, the manufacturing yield of the tape carrier is improved.

Further, the above-mentioned tape carrier package semiconductor device is characterized in that the solder resist is made of any of rubber, polyimide, urethane, silicon and epoxy solder resists.

With the above-mentioned arrangement, the solder resist, which is any of rubber, polyimide, urethane, silicon and epoxy solder resists, forms a highly flexible insulating protective film.

Moreover, the liquid crystal panel display of the present invention, which has and a liquid crystal panel and a tape carrier package semiconductor device that is provided with a tape carrier having a metal wiring pattern installed on an insulating tape and insulating protective films for insulating and coating the surface and back sides of a through hole formed in the insulating tape so as to allow the metal wiring pattern to bend, and a semiconductor element packaged on the tape carrier so as to drive the liquid crystal panel, is characterized in that the insulating protective films for insulating and coating the surface and back sides of the through hole respectively are made of solder resist whose young's modulus is in the range of 5 kgf/mm$^2$ to 70 kgf/mm$^2$.

In the above-mentioned construction, pieces of the solder resist whose young's modulus is in the range of 5 kgf/mm$^2$ to 70 kgf/mm$^2$ are formed as the insulating protective films for insulating and coating the surface and back sides of the through hole respectively. Thus, the liquid crystal panel display is allowed to have the tape carrier package semiconductor device having high flexibility.

Therefore, even when the tape carrier package semiconductor devices are packaged on a liquid crystal panel, the metal wiring pattern is hardly susceptible to disconnection. Further, the warping in the tape carrier package semiconductor device is suppressed, and the manufacturing yield of the liquid crystal panel display can be improved.

Further, the above-mentioned tape carrier package semiconductor device is characterized in that the solder resist is made of the same material on both the surface and back sides of the through hole.

In this arrangement, the solder resist made of the same material is formed on both the surface and back sides of the through hole. Since only one kind of solder resist is used, only one dedicated device is required upon forming the solder resist on both the surface and back side of the through hole, and the management of the solder resist is easily carried out.

Therefore, it becomes possible to manufacture the liquid crystal panel display at low costs.

Moreover, the above-mentioned liquid crystal panel display is characterized in that the solder resist contains a filler that determines the viscosity thereof in the range of 10 wt % to 40 wt %.

thus, it becomes possible to manufacture a large-size liquid crystal panel display of not less than 10 inches with high yield.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

TABLE 1

| Kinds of Sample | Young's Modulus (kgf/mm$^2$) | Number of Temperature Cycles up to Disconnection |||||||||||
|---|---|---|---|---|---|---|---|---|---|---|---|
| | | 10 | 20 | 30 | 50 | 250 | 300 | 400 | 500 | 600 | 700 |
| 1. TEG using Epoxy Solder Resist | 200 | 0/5 | 1/5 | 4/4 | | | | | | | |
| 2. TEG using Epoxy and Polyimide Solder Resists | 380, 50 | 0/5 | 0/5 | — | 0/5 | 1/5 | 0/4 | 2/4 | 0/2 | 1/2 | 1/1 |
| 3. TEG using Polyimide Solder Resist | 15 | 0/5 | 0/5 | — | 0/5 | 0/5 | 0/5 | 0/5 | 1/5 | 0/4 | 2/4 |
| 4. TEG using Urethane Solder Resist | 33 | 0/4 | 0/4 | 0/4 | 0/4 | 0/4 | 0/4 | 2/4 | 0/2 | 2/2 | |
| 5. TCP Semiconductor Device using Exopy Solder Resist | 200 | 0/5 | 0/5 | — | 0/5 | 0/5 | 0/5 | 0/5 | 3/5 | 2/2 | |

TABLE 3

| Kinds of Sample | Young's Modulus (kgf/mm$^2$) at region p | Young's Modulus (kgf/mm$^2$) at region q | Number of Temperature Cycles up to Disconnection |||||||||||
|---|---|---|---|---|---|---|---|---|---|---|---|---|
| | | | 10 | 20 | 30 | 50 | 250 | 300 | 400 | 500 | 600 | 700 |
| 1. Sample 1 | 200 | 50 | 0/5 | 1/5 | 4/4 | | | | | | | |
| 2. Sample 2 | 380, 50 | 50 | 0/5 | 0/5 | — | 0/5 | 1/5 | 0/4 | 2/4 | 0/2 | 1/2 | 1/1 |
| 3. Sample 3 | 15 | 15 | 0/5 | 0/5 | — | 0/5 | 0/5 | 0/5 | 0/5 | 0/5 | 0/4 | 0/5 |
| 4. Sample 4 | 15 | 38 | 0/5 | 0/5 | — | 0/5 | 0/5 | 0/5 | 0/5 | 0/5 | 0/4 | 0/5 |
| 5. Sample 5 | 38 | 38 | 0/5 | 0/5 | 0/5 | 0/5 | 0/5 | 0/5 | 0/5 | 0/5 | 0/5 | 1/5 |
| 6. Sample 6 | 42 | 42 | 0/5 | 0/5 | 0/5 | 0/5 | 0/5 | 0/5 | 0/5 | 1/5 | 0/4 | 1/4 |
| 7. Sample 7 | 200 | 50 | 0/5 | 0/5 | — | 0/5 | 0/5 | 0/5 | 0/5 | 3/5 | 2/2 | |

In the above-mentioned arrangement, the solder resist contains a filler in the range of 10 wt % to 40 wt %. This makes it possible to prevent the occurrence of bleeding upon printing the solder resist, and to improve the patterning precision. Since separation of solder resist is prevented upon manufacturing the tape carrier, the manufacturing yield of the tape carrier is improved.

Further, the above-mentioned liquid crystal panel display is characterized in that the solder resist is made of any of rubber, polyimide, urethane, silicon and epoxy solder resists.

With the above-mentioned arrangement, the solder resist, which is any of rubber, polyimide, urethane, silicon and epoxy solder resists, forms a highly flexible insulating protective film.

Moreover, the above-mentioned liquid crystal panel display is characterized in that the liquid crystal panel has a size of not less than 10 inches.

With the above-mentioned arrangement, even in a large-size liquid crystal panel of not less than 10 inches applied to the liquid crystal panel display, the insulating protective film of the tape carrier package semiconductor device has high flexibility, and ensures high manufacturing yield.

Therefore, even when the tape carrier package semiconductor devices are packaged on a liquid crystal panel, the metal wiring pattern is less susceptible to disconnection;

What is claimed is:

1. A tape carrier package semiconductor device, which includes a tape carrier and semiconductor elements that have been packaged on the tape carrier, said tape carrier package semiconductor device comprising:
   an insulating tape,
   a metal wiring pattern installed on one surface of the insulating tape, the metal wiring pattern being provided on a metal-wiring-pattern side of the insulating tape,
   a through hole that is provided in a manner so as to penetrate the insulating tape so that the insulating tape is allowed to bend,
   on the metal-wiring-pattern side of the insulating tape, a first solder resist insulating protective film for insulating and covering the metal wiring pattern and the through hole at locations over and proximate the through hole,
   on a side of the insulating tape opposite the metal-wiring-pattern side, a second solder resist insulating protective film for insulating and covering the through hole, and
   resin scaling peripheral portions where the metal wiring pattern and a semiconductor element are connected;
   wherein the first and second solder resist insulating protective films comprise solder resist whose young's modulus is in the range of 5 kgf/mm$^2$ to 70 kgf/mm$^2$, and wherein on the metal-wiring-pattern side of the insulating tape no solder resist insulating protective film other than said first wider resist insulating protective film covers the metal wiring pattern proximate the through hole, and wherein the solder resist of the first insulating protective film includes a filler in the range of 10 wt % to 40 wt % that determines viscosity thereof.

2. The tape carrier package semiconductor device as defined in claim 1, wherein the solder resist forming the first and second insulating protective films has a thickness in the range of 5 $\mu$m to 45 $\mu$m.

3. The tape carrier package semiconductor device as defined in claim 1, wherein the solder resist forming the first and second insulating protective films is made of any of rubber, polyimide, epoxy, silicon and urethane solder resists.

4. The tape carrier package semiconductor device as defined in claim 1, wherein the periphery of portions at which the tape canter and the semiconductor elements have been electrically connected is covered with liquid resin having an insulating property in a manner so as to allow the edge of the liquid resin to make an angle of not more than 70° with the upper surface of the first insulating protective film.

5. The tape carrier package semiconductor device as defined in claim 1, wherein the first and second insulating films are made of the same material.

6. The tape carrier package semiconductor device as defined in claim 5, wherein the solder resist forming the first and second insulating protective films has a thickness in the range of 5 $\mu$m to 45 $\mu$m.

7. A liquid crystal panel display, which is provided with a liquid crystal panel and a tape carrier package semiconductor device having a tape earner and semiconductor elements that have been packaged on the tape carrier so as to drive the liquid crystal panel, wherein said tape carrier comprises:
  an insulating tape,
  a metal wiring pattern installed on one surface of the insulating tape, the metal wiring pattern being provided on a metal-wiring-pattern side of the insulating tape,
  a through hole that is provided in a manner so as to penetrate the insulating tape so that the insulating tape is allowed to bend,
  on the metal-wiring-pattern side of the insulating tape, a first solder resist insulating protective film for insulating and covering the metal wiring pattern and the through hole at locations over and proximate the through hole,
  on a side of the insulating tape opposite the metal-wiring-pattern side, a second solder resist insulating protective film for insulating and covering the through hole, and
  resin for sealing periphery portions at which the semiconductor device and the metal wiring pattern are connected,
  wherein the first and second solder resist insulating protective films comprise solder resist whose young's modulus is in the range of 5 kgf/mm² to 70 kgf/mm², and wherein on the metal-wiring-pattern side of the insulating tape no solder resist film other than the first solder resist insulating protective film insulates and covers the metal wiring pattern proximate the through hole, and the solder resist of the first solder resist insulating protective film includes a filler in the range of 10 wt % to 40 wt % that determines viscosity thereof.

8. The liquid crystal panel display as defined in claim 7, wherein the solder resist forming the first and second insulating protective films has a thickness in the range of 5 $\mu$m to 45 $\mu$m.

9. The liquid crystal panel display as defined in claim 7, wherein the solder resist forming the first and second insulating protective films is made of any of rubber, polyimide, epoxy, silicon and urethane solder resists.

10. The liquid crystal panel display as defined in claim 7, wherein the periphery of portions at which the tape carrier and the driving semiconductor elements have been electrically connected is covered with liquid resin having an insulating property in a manner so as to allow the edge of the liquid resin to make an angle of not more than 70° with the upper surface of the first insulating protective film.

11. The liquid crystal panel display as defined in claim 7, wherein the first and second insulating films are made of the same material.

12. The liquid crystal panel display as defined in claim 11, wherein the solder resist forming the first and second insulating protective films has a thickness in the range of 5 $\mu$m to 45 $\mu$m.

13. The liquid crystal panel display as defined in claim 7, wherein the liquid crystal panel has a size of not less than 10 inches.

14. A tape carrier package semiconductor device comprising:
  an insulating tape,
  a metal wiring pattern on one surface of the insulating tape, the metal wiring pattern being provided on a metal-wiring-pattern side of the insulating tape
  a through hole provided in a manner so as to penetrate the insulating tape so chat the insulating tape is allowed to bend,
  on the metal-wiring-pattern side of the insulating tape, a first solder resist insulating protective film for insulating and covering the metal wiring pattern and the through hole, and
  on a side of the insulating tape opposite the metal-wiring-pattern side, a second solder resist insulating protective film for insulating and covering the through hole,
  wherein the first and second solder resist insulating protective films comprise the same material of solder resist whose young's modulus is in the range of 5 kgf/mm² to 70 kgf/mm², and on the metal-wiring-pattern side of the insulating tape no insulating solder resist other than said first solder resist insulating protective film covers the metal wiring pattern near the through hole, and
  wherein the solder resist of the first solder resist insulating protective film includes a filler in the range of 10 wt % to 40 wt % that determines viscosity thereof.

15. A tape carrier package semiconductor device, which has a tape carrier and semiconductor elements that have been packaged on the tape carrier, characterized in that said tape carrier comprises:
  an insulating tape,
  a metal wiring pattern installed on one surface of the insulating tape,
  a through hole that is provided in a manner so as to penetrate the insulating tape so that the insulating tape is allowed to bend,
  a first insulating protective film for insulating and covering the metal wiring pattern and the through hole on a metal-wiring-pattern side of the insulating tape,
  a second insulating protective film for insulating and covering the through hole on the side opposite to the metal-wiring-pattern side,
  wherein the first and second insulating protective films comprise solder resist whose young's modulus is in the range of 5 kgf/mm² to 70 kgf/mm² so that all solder resist films proximate the through hole on both sides of the insulating tape are characterized by a young's modulus is in the range of 5 kgf/mm² to 70 kgf/mm² and wherein the solder resist of the first insulating protective film contains a filler that determines the viscosity thereof in the range of 10 wt % to 40 wt %.

16. A liquid crystal panel display, which is provided with a liquid crystal panel and a tape carrier package semiconductor device having a tape carrier and semiconductor elements that have been packaged on the tape carrier so as to drive the liquid crystal panel, characterized in that said tape carrier comprises:

an insulating tape, a metal wiring pattern installed on one surface of the insulating tape, a through hole that is provided in a manner so as to penetrate the insulating tape so that the insulating tape is allowed to bend, a first insulating protective film for insulating and covering the metal wiring pattern and the through hole on a metal-wiring-pattern side of the insulating tape, a second insulating protective film for insulating and covering the through hole on the side opposite to the metal-wiring-pattern side, wherein the first and second insulating protective films comprise solder resist whose young's modulus is in the range of 5 kgf/mm² to 70 kgf/mm² so that all solder resist films proximate the through hole on both sides of the insulating tape are characterized by a young's modulus as in the range of 5 kgf/mm² to 70 kgf/mm², and wherein the solder resist of the first insulating protective film contains a filler that determines the viscosity thereof in the range of 10 wt % to 40 wt %.

17. A tape carrier package semiconductor device, which has a tape carrier and semiconductor elements that have been packaged on the tape carrier, characterized in that said tape carrier comprises:

an insulating tape, a metal wiring pattern installed on one surface of the insulating tape, a through hole that is provided in a manner so as to penetrate the insulating tape so that the insulating tape is allowed to bend, a first insulating protective film for insulating and covering the metal wiring pattern and the through hole on a metal wiring-pattern side of the insulating tape, a second insulating protective film for insulating and covering the through hole on the side opposite to the metal-wiring-pattern side, wherein the first and second insulating protective films comprise solder resist whose young's modulus is in the range of 5 kgf/mm² to 70 kgf/mm² so that all solder resist films proximate the through hole on both sides of the insulating tape are characterized by a young's modulus is in the range of 5 kgf/mm² to 70 kgf/mm², and wherein the first insulating protective film comprises solder resist of one kind, and the solder resist contains a filler which determines viscosity thereof in a range of 10 wt % to 40 wt %.

18. A liquid crystal panel display, which is provided with a liquid crystal panel and a tape carrier package semiconductor device having a tape carrier and semiconductor elements that have been packaged on the tape carrier so as to drive the liquid crystal panel, characterized in that said tape carrier comprises:

an insulating tape, a metal wiring pattern installed on one surface of the insulating tape, a through hole that is provided in a manner so as to penetrate the insulating tape so that the insulating tape is allowed to bend, a first insulating protective film for insulating and covering the metal wiring pattern and the through hole on a metal-wiring-pattern side of the tape, a second insulating protective film for insulating and covering the through hole on the side opposite to the metal-wiring-pattern side, wherein the first and second insulating protective films are made of solder resist whose young's modulus is in the range of 5 kgf/mm² to 70 kgf/mm², and wherein the first insulating protective film is made of only one kind of solder resist and contains a filler that determines viscosity thereof in the range of 10 wt % to 40 wt %.

* * * * *